(12) United States Patent
Meyer

(10) Patent No.: US 8,748,727 B2
(45) Date of Patent: Jun. 10, 2014

(54) FLAT-PLATE PHOTOVOLTAIC MODULE

(75) Inventor: Dallas W. Meyer, Prior Lake, MN (US)

(73) Assignee: Tenksolar, Inc., Minneapolis, MN (US)

( * ) Notice: Subject to any disclaimer, the term of this patent is extended or adjusted under 35 U.S.C. 154(b) by 735 days.

(21) Appl. No.: 12/357,268

(22) Filed: Jan. 21, 2009

(65) Prior Publication Data

US 2009/0183763 A1 Jul. 23, 2009

Related U.S. Application Data

(60) Provisional application No. 61/022,232, filed on Jan. 18, 2008, provisional application No. 61/022,264, filed on Jan. 18, 2008, provisional application No. 61/022,253, filed on Jan. 18, 2008, provisional application No. 61/022,267, filed on Jan. 18, 2008, provisional application No. 61/022,228, filed on Jan. 18, 2008, provisional application No. 61/022,234, filed on Jan. 18, 2008, provisional application No. 61/022,236, filed on Jan. 18, 2008, provisional application No. 61/022,240, filed on Jan. 18, 2008, provisional application No. 61/022,242, filed on Jan. 18, 2008, provisional application No. 61/022,277, filed on Jan. 18, 2008, provisional application No. 61/022,278, filed on Jan. 18, 2008, provisional application No. 61/025,570, filed on Feb. 1, 2008, provisional application No. 61/022,245, filed on Jan. 18, 2008, provisional application No. 61/025,575, filed on Feb. 1, 2008, provisional application No. 61/022,246, filed on Jan. 18, 2008, provisional application No. 61/022,258, filed on Jan. 18, 2008, provisional application No. 61/022,263, filed on Jan. 18, 2008, provisional application No. 61/022,249, filed on Jan. 18, 2008, provisional application No. 61/022,280, filed on Jan. 18, 2008, provisional application No. 61/022,252, filed on Jan. 18, 2008, provisional application No. 61/025,578, filed on Feb. 1, 2008, provisional application No. 61/025,581, filed on Feb. 1, 2008, provisional application No. 61/033,203, filed on Mar. 3, 2008, provisional application No. 61/035,976, filed on Mar. 12, 2008, provisional application No. 61/058,485, filed on Jun. 3, 2008, provisional application No. 61/080,628, filed on Jul. 14, 2008, provisional application No. 61/091,642, filed on Aug. 25, 2008, provisional application No. 61/101,344, filed on Sep. 30, 2008, provisional application No. 61/111,239, filed on Nov. 4, 2008, provisional application No. 61/033,200, filed on Mar. 3, 2008, provisional application No. 61/119,585, filed on Dec. 3, 2008.

(51) Int. Cl.
*H01L 31/05* (2014.01)

(52) U.S. Cl.
USPC ............................................. 136/244; 307/71

(58) Field of Classification Search
USPC .................................. 136/243–246, 251, 293
See application file for complete search history.

(56) References Cited

U.S. PATENT DOCUMENTS

| | | | |
|---|---|---|---|
| 3,094,439 A | 6/1963 | Mann et al. | |
| 3,350,234 A | 10/1967 | Ule | |
| 3,419,434 A | 12/1968 | Colehower | |
| 3,833,426 A | 9/1974 | Mesch | |
| 4,002,160 A | 1/1977 | Mather | |
| 4,020,827 A | 5/1977 | Broberg | |
| 4,033,327 A | 7/1977 | Pei | |
| 4,120,282 A | 10/1978 | Espy | |
| 4,154,998 A | 5/1979 | Luft et al. | |
| 4,158,768 A | 6/1979 | Lavelli | |
| 4,212,293 A | 7/1980 | Nugent | |
| 4,227,298 A | 10/1980 | Keeling | |
| 4,309,334 A | 1/1982 | Valitsky | |
| 4,316,448 A | 2/1982 | Dodge | |
| 4,321,416 A | 3/1982 | Tennant | |
| 4,369,498 A | 1/1983 | Schulte | |
| 4,410,757 A | 10/1983 | Stamminger et al. | |
| 4,461,922 A * | 7/1984 | Gay et al. | 136/249 |
| 4,481,378 A | 11/1984 | Lesk | |
| 4,514,579 A | 4/1985 | Hanak | |
| 4,604,494 A | 8/1986 | Shepard, Jr. | |

| Patent Number | Date | Name |
|---|---|---|
| 4,611,090 A | 9/1986 | Catella |
| 4,617,421 A | 10/1986 | Nath |
| 4,695,788 A | 9/1987 | Marshall |
| 4,716,258 A | 12/1987 | Murtha |
| 4,747,699 A | 5/1988 | Kobayashi et al. |
| 4,755,921 A | 7/1988 | Nelson |
| 4,773,944 A | 9/1988 | Nath |
| 4,854,974 A | 8/1989 | Carlson |
| 4,933,022 A | 6/1990 | Swanson |
| 4,964,713 A | 10/1990 | Goetzberger |
| 4,966,631 A | 10/1990 | Matlin |
| 5,013,141 A | 5/1991 | Sakata |
| 5,021,099 A | 6/1991 | Kim |
| 5,048,194 A | 9/1991 | McMurtry |
| 5,096,505 A * | 3/1992 | Fraas et al. .................. 136/246 |
| 5,205,739 A | 4/1993 | Malo |
| 5,246,782 A | 9/1993 | Kennedy |
| 5,268,037 A | 12/1993 | Glatfelter |
| 5,270,636 A | 12/1993 | Lafferty |
| 5,288,337 A | 2/1994 | Mitchell |
| 5,344,497 A | 9/1994 | Fraas |
| 5,374,317 A | 12/1994 | Lamb |
| 5,457,057 A | 10/1995 | Nath |
| 5,468,988 A | 11/1995 | Glatfelter |
| 5,478,402 A | 12/1995 | Hanoka |
| 5,491,040 A | 2/1996 | Chaloner-Gill |
| 5,493,096 A | 2/1996 | Koh |
| 5,505,789 A | 4/1996 | Fraas |
| 5,513,075 A | 4/1996 | Capper |
| 5,538,563 A | 7/1996 | Finkl |
| 5,571,338 A | 11/1996 | Kadonome |
| 5,593,901 A | 1/1997 | Oswald |
| 5,719,758 A | 2/1998 | Nakata |
| 5,735,966 A | 4/1998 | Luch |
| 5,745,355 A | 4/1998 | Tracy et al. |
| 5,801,519 A | 9/1998 | Midya |
| 5,896,281 A | 4/1999 | Bingley |
| 5,910,738 A | 6/1999 | Shinohe |
| 5,982,157 A | 11/1999 | Wattenhoffer |
| 5,990,413 A | 11/1999 | Ortabasi |
| 5,994,641 A | 11/1999 | Kardauskas |
| 6,011,215 A | 1/2000 | Glatfelter |
| 6,017,002 A | 1/2000 | Burke et al. |
| 6,043,425 A | 3/2000 | Assad |
| 6,077,722 A | 6/2000 | Jansen |
| 6,111,189 A | 8/2000 | Garvison |
| 6,111,454 A | 8/2000 | Shinohe |
| 6,111,767 A | 8/2000 | Handleman |
| 6,134,784 A | 10/2000 | Carrie |
| 6,177,627 B1 | 1/2001 | Murphy |
| 6,188,012 B1 | 2/2001 | Ralph |
| 6,201,180 B1 | 3/2001 | Meyer |
| 6,288,325 B1 | 9/2001 | Jansen |
| 6,294,723 B2 | 9/2001 | Uematsu |
| 6,331,208 B1 | 12/2001 | Nishida |
| 6,337,436 B1 | 1/2002 | Ganz |
| 6,339,538 B1 | 1/2002 | Handleman |
| 6,351,130 B1 | 2/2002 | Preiser |
| 6,462,265 B1 | 10/2002 | Sasaoka et al. |
| 6,465,724 B1 | 10/2002 | Garvison |
| 6,515,215 B1 | 2/2003 | Mimura |
| 6,528,716 B2 | 3/2003 | Collette |
| 6,706,963 B2 | 3/2004 | Gaudiana |
| 6,739,692 B2 | 5/2004 | Unosawa |
| 6,750,391 B2 | 6/2004 | Bower |
| 6,753,692 B2 | 6/2004 | Toyomura |
| 6,803,513 B2 | 10/2004 | Beernink |
| 6,858,461 B2 | 2/2005 | Oswald |
| 6,870,087 B1 | 3/2005 | Gallagher |
| 6,882,063 B2 | 4/2005 | Droppo |
| 6,903,261 B2 | 6/2005 | Habraken |
| 6,966,184 B2 | 11/2005 | Toyomura |
| 6,992,256 B1 | 1/2006 | Wiley |
| 7,009,412 B2 | 3/2006 | Chong |
| 7,094,441 B2 | 8/2006 | Chittibabu |
| 7,099,169 B2 * | 8/2006 | West et al. .................. 363/132 |
| 7,138,730 B2 | 11/2006 | Lai |
| 7,205,626 B1 | 4/2007 | Nakata |
| 7,259,322 B2 | 8/2007 | Gronet |
| 7,276,724 B2 | 10/2007 | Sheats |
| 7,297,865 B2 | 11/2007 | Terao |
| 7,301,095 B2 | 11/2007 | Murphy |
| 7,336,004 B2 | 2/2008 | Lai |
| 7,339,108 B2 | 3/2008 | Tur |
| 7,342,171 B2 | 3/2008 | Khouri |
| 7,388,146 B2 | 6/2008 | Fraas |
| 7,432,438 B2 | 10/2008 | Rubin et al. |
| 7,498,508 B2 | 3/2009 | Rubin et al. |
| 7,997,938 B2 | 8/2011 | Costello et al. |
| 8,013,239 B2 | 9/2011 | Rubin et al. |
| 8,138,631 B2 | 3/2012 | Allen et al. |
| 8,212,139 B2 | 7/2012 | Meyer |
| 8,563,847 B2 | 10/2013 | Meyer |
| 2001/0008144 A1 | 7/2001 | Uematsu |
| 2002/0179140 A1 | 12/2002 | Toyomura |
| 2003/0047208 A1 | 3/2003 | Glenn et al. |
| 2003/0121228 A1 | 7/2003 | Stoehr |
| 2003/0121542 A1 | 7/2003 | Harneit et al. |
| 2003/0201007 A1 | 10/2003 | Fraas |
| 2004/0016454 A1 * | 1/2004 | Murphy et al. ............... 136/244 |
| 2004/0055594 A1 | 3/2004 | Hochberg |
| 2004/0089337 A1 | 5/2004 | Chou |
| 2004/0261834 A1 | 12/2004 | Basore |
| 2004/0261955 A1 | 12/2004 | Shingleton et al. |
| 2005/0000562 A1 | 1/2005 | Kataoka et al. |
| 2005/0022857 A1 | 2/2005 | Daroczi |
| 2005/0034751 A1 | 2/2005 | Gross |
| 2005/0061360 A1 | 3/2005 | Horioka et al. |
| 2005/0081909 A1 | 4/2005 | Paull |
| 2005/0115176 A1 | 6/2005 | Russell |
| 2005/0121067 A1 | 6/2005 | Toyomura et al. |
| 2005/0133081 A1 | 6/2005 | Amato |
| 2005/0158891 A1 | 7/2005 | Barth |
| 2005/0172995 A1 | 8/2005 | Rohrig |
| 2005/0194939 A1 | 9/2005 | Duff, Jr. |
| 2005/0263179 A1 | 12/2005 | Guadiana |
| 2005/0268959 A1 | 12/2005 | Aschenbrenner |
| 2005/0278076 A1 | 12/2005 | Barbir |
| 2006/0001406 A1 | 1/2006 | Matan |
| 2006/0042681 A1 | 3/2006 | Korman |
| 2006/0054212 A1 | 3/2006 | Fraas |
| 2006/0092588 A1 | 5/2006 | Realmuto et al. |
| 2006/0162772 A1 | 7/2006 | Presher, Jr. |
| 2006/0174931 A1 | 8/2006 | Mapes et al. |
| 2006/0174939 A1 * | 8/2006 | Matan ............................ 136/293 |
| 2006/0180197 A1 | 8/2006 | Gui |
| 2006/0185716 A1 | 8/2006 | Murozono |
| 2006/0185727 A1 | 8/2006 | Matan |
| 2006/0213548 A1 | 9/2006 | Bachrach |
| 2006/0225777 A1 | 10/2006 | Buechel |
| 2006/0235717 A1 | 10/2006 | Sharma |
| 2006/0261830 A1 | 11/2006 | Taylor |
| 2006/0266407 A1 | 11/2006 | Lichey |
| 2007/0035864 A1 | 2/2007 | Vasylyev |
| 2007/0056626 A1 | 3/2007 | Funcell |
| 2007/0068567 A1 | 3/2007 | Rubin et al. |
| 2007/0079861 A1 | 4/2007 | Morali |
| 2007/0095384 A1 | 5/2007 | Farquhar |
| 2007/0103108 A1 | 5/2007 | Capp |
| 2007/0113885 A1 | 5/2007 | Chan |
| 2007/0124619 A1 | 5/2007 | Mizukami |
| 2007/0125415 A1 | 6/2007 | Sachs |
| 2007/0144577 A1 | 6/2007 | Rubin et al. |
| 2007/0151594 A1 | 7/2007 | Mascolo et al. |
| 2007/0157964 A1 | 7/2007 | Gronet |
| 2007/0186971 A1 | 8/2007 | Lochun |
| 2007/0193620 A1 | 8/2007 | Hines |
| 2007/0199588 A1 | 8/2007 | Rubin et al. |
| 2007/0215195 A1 | 9/2007 | Buller |
| 2007/0235077 A1 | 10/2007 | Nagata |
| 2007/0240755 A1 | 10/2007 | Lichy |
| 2007/0251569 A1 | 11/2007 | Shan |
| 2007/0261731 A1 | 11/2007 | Abe |
| 2007/0266672 A1 | 11/2007 | Bateman |
| 2007/0272295 A1 | 11/2007 | Rubin et al. |
| 2007/0273338 A1 | 11/2007 | West |
| 2007/0295381 A1 | 12/2007 | Fujii |
| 2008/0000516 A1 | 1/2008 | Shifman |

| | | | |
|---|---|---|---|
| 2008/0029149 | A1 | 2/2008 | Simon |
| 2008/0029152 | A1 | 2/2008 | Milshtein |
| 2008/0037141 | A1 | 2/2008 | Tom |
| 2008/0092944 | A1 | 4/2008 | Rubin et al. |
| 2008/0142071 | A1 | 6/2008 | Dorn et al. |
| 2008/0163922 | A1 | 7/2008 | Horne et al. |
| 2008/0164766 | A1 | 7/2008 | Adest et al. |
| 2008/0210286 | A1 | 9/2008 | Ball |
| 2008/0290368 | A1 | 11/2008 | Rubin |
| 2008/0298051 | A1* | 12/2008 | Chu .............................. 362/183 |
| 2009/0025778 | A1 | 1/2009 | Rubin et al. |
| 2009/0121968 | A1 | 5/2009 | Okamoto |
| 2009/0151775 | A1 | 6/2009 | Pietrzak |
| 2009/0183760 | A1 | 7/2009 | Meyer |
| 2009/0183764 | A1 | 7/2009 | Meyer |
| 2009/0217965 | A1 | 9/2009 | Dougal et al. |
| 2009/0242021 | A1 | 10/2009 | Petkie et al. |
| 2009/0250093 | A1 | 10/2009 | Chen |
| 2010/0000165 | A1 | 1/2010 | Koller |
| 2010/0014738 | A1 | 1/2010 | Birnholz et al. |
| 2010/0089390 | A1 | 4/2010 | Miros et al. |
| 2010/0131108 | A1 | 5/2010 | Meyer |
| 2010/0212720 | A1 | 8/2010 | Meyer |
| 2010/0253151 | A1 | 10/2010 | Gerhardinger et al. |
| 2010/0282293 | A1 | 11/2010 | Meyer |
| 2010/0313933 | A1 | 12/2010 | Xu |
| 2011/0039992 | A1 | 2/2011 | Irie |
| 2011/0067748 | A1 | 3/2011 | Pfeiffer |
| 2011/0241431 | A1 | 10/2011 | Chen et al. |
| 2012/0204935 | A1 | 8/2012 | Meyer et al. |
| 2012/0234374 | A1 | 9/2012 | Meyer |
| 2013/0062956 | A1 | 3/2013 | Meyer |
| 2013/0312812 | A1 | 11/2013 | Meyer |

FOREIGN PATENT DOCUMENTS

| | | |
|---|---|---|
| DE | 3708548 | 9/1988 |
| DE | 4027325 | 4/1992 |
| DE | 20314372 | 12/2003 |
| DE | 102004001248 | 1/2005 |
| DE | 202006020180 | 12/2007 |
| EP | 1724842 | 11/2006 |
| EP | 1744372 | 1/2007 |
| EP | 2172980 | 4/2010 |
| EP | 2251941 | 11/2010 |
| GB | 2331530 | 5/1999 |
| JP | 60-141152 | 9/1985 |
| JP | 02-025079 | 1/1990 |
| JP | 09-045946 | 2/1997 |
| JP | 10-245935 | 9/1998 |
| JP | 10-281562 | 10/1998 |
| JP | 11-041832 | 2/1999 |
| JP | 11-103538 | 4/1999 |
| JP | 2000-114571 | 4/2000 |
| JP | 2000-213255 | 8/2000 |
| JP | 2001-268891 A | 9/2001 |
| JP | 2002-073184 | 3/2002 |
| JP | 2002-305318 A | 10/2002 |
| JP | 2002-314112 | 10/2002 |
| JP | 2003-026455 A | 1/2003 |
| JP | 2007-234795 | 9/2007 |
| JP | 2007-294630 A | 11/2007 |
| JP | 2009-503870 | 1/2009 |
| JP | 2009-545877 | 12/2009 |
| JP | 2011-129626 | 6/2011 |
| KR | 10-1998-087002 | 12/1998 |
| KR | 10-2007-0104300 | 10/2007 |
| KR | 10-2007-0107318 | 11/2007 |
| KR | 10-2010-0129721 | 12/2010 |
| TW | 201042770 | 12/2010 |
| TW | 201106490 | 12/2011 |
| WO | WO 02/35613 | 2/2002 |
| WO | 2004/021455 | 3/2004 |
| WO | 2007/071064 | 6/2007 |
| WO | 2007/095757 | 8/2007 |
| WO | 2007/137407 | 12/2007 |
| WO | WO 2008/016453 | 2/2008 |
| WO | 2008/028677 | 3/2008 |
| WO | 2008/042828 | 4/2008 |
| WO | 2008/046201 | 4/2008 |
| WO | 2008/141415 | 11/2008 |
| WO | 2009/012567 | 1/2009 |
| WO | 2009/076740 | 6/2009 |
| WO | WO 2009/009211 | 7/2009 |
| WO | 2010/012062 | 2/2010 |
| WO | 2010/037393 | 4/2010 |
| WO | WO 2010/068226 | 6/2010 |
| WO | 2010/096833 | 8/2010 |
| WO | 2010/148009 | 12/2010 |
| WO | 2011/011855 | 2/2011 |
| WO | 2011/109741 | 9/2011 |

OTHER PUBLICATIONS

U.S. Appl. No. 12/357,260, filed Jan. 21, 2009, Meyer.
PCT/US2010/061864 International Search Report mailed Aug. 31, 2011.
U.S. Appl. No. 13/207,614, filed Aug. 10, 2011, Meyer et al.
International Search Report and Written Opinion dated Sep. 29, 2009 as issued in International Application No. PCT/US2009/031597 filed Jan. 21, 2009.
International Search Report and Written Opinion, mailed Sep. 27, 2010, as issued in connection with International Patent Application No. PCT/US2010/025108.
International Preliminary Report mailed Dec. 29, 2011, as issued in connection with International Patent Application No. PCT/US2010/038702.
International Search Report mailed Mar. 19, 2012 as issued in connection with International Patent Application No. PCT/US2011/047291.
U.S. Appl. No. 12/684,595, Mail Date Jan. 25, 2012, Restriction Requirement.
U.S. Appl. No. 12/684,595, Mail Date Mar. 16, 2012, Notice of Allowance.
U.S. Appl. No. 12/357,260, Mail Date Aug. 2, 2012, Restriction Requirement.
U.S. Appl. No. 12/357,277, Mail Date Jan. 26, 2012, Office Action.
U.S. Appl. No. 12/357,277, Mail Date Jul. 19, 2012, Office Action.
U.S. Appl. No. 12/711,040, Mail Date Jun. 18, 2012, Restriction Requirement.
U.S. Appl. No. 12/815,913, Mail Date May 29, 2012, Restriction Requirement.
Japanese Office Action dated Feb. 19, 2013 in Japanese Application No. 2011-551303.
Zeghbroeck, Bart V., Ellipsometer Data Table, http://ece-www.colorado.edu/~bart/book/ellipstb.htm, 1997.
Supplemental European Search Report dated May 2, 2013 as received in European Application No. 10790069.8.
Japanese Office Action dated Apr. 30, 2013 in Japanese Application No. 2012-516209.
Solatron Techonologies, Wiring Solar Modules and Batteries, <http://web.archive.org/web/20030206212224/http://partsonsale.com/learnwiring.htm>, web archived May 2008.
U.S. Appl. No. 12/357,260, Mail Date Feb. 5, 2013, Office Action.
U.S. Appl. No. 12/357,260, Mail Date May 23, 2013, Office Action.
U.S. Appl. No. 12/711,040, Mail Date Jul. 5, 2013, Office Action.
U.S. Appl. No. 12/815,913, Mail Date Oct. 5, 2012, Office Action.
U.S. Appl. No. 13/207,164, Mail Date Feb. 14, 2013, Office Action.
Supplementary European Search Report dated Jun. 13, 2013 as received in Application No. EP 09 70 2762.
International Search Report and Written Opinion, mailed Jan. 21, 2009, as issued in connection with International Patent Application No. PCT/US2009/031596.
International Search Report and Written Opinion, mailed Jun. 25, 2009, as issued in connection with International Patent Application No. PCT/US2009/031594.
International Search Report mailed Jan. 5, 2011, as issued in connection with International Patent Application No. PCT/US2010/038702.
International Search Report and Written Opinion mailed Mar. 19, 2013 as issued in connection with International Patent Application No. PCT/US2012/062784.

(56) References Cited

OTHER PUBLICATIONS

International Search Report and Written Opinion mailed Jan. 28, 2014 as issued in connection with International Patent Application No. PCT/US2013/062747.
Supplementary European Search Report dated Jan. 17, 2014 as received in European Application No. 10744485.3.
U.S. Appl. No. 13/485,210, Mail Date Jan. 15, 2014, Restriction Requirement.
U.S. Appl. No. 12/357,277, Mail Date Nov. 10, 2011, Restriction Requirement.
U.S. Appl. No. 12/711,040, Mail Date Nov. 26, 2012, Office Action.
U.S. Appl. No. 12/815,913, Mail Date Sep. 3, 2013, Notice of Allowance.
U.S. Appl. No. 13/207,164, Mail Date Sep. 28, 2012, Restriction Requirement.
U.S. Appl. No. 13/207,164, Mail Date Aug. 29, 2013, Office Action.
U.S. Appl. No. 13/207,164, Mail Date Nov. 27, 2013, Notice of Allowance.

\* cited by examiner

*Primary Examiner* — Basia Ridley
*Assistant Examiner* — Christina Chern
(74) *Attorney, Agent, or Firm* — Maschoff Brennan

(57) ABSTRACT

One example embodiment includes a PV module comprising a conductive backsheet, a non-conductive layer disposed on the conductive backsheet, a plurality of PV cells arranged in rows and collectively generating a first power output characterized by a first voltage, and a power conversion device. Each of the rows can include two or more PV cells. The PV cells within each row can be connected to each other in parallel. The rows can be connected in series. A top row can be connected to the conductive backsheet. The power conversion device can be redundantly connected to a bottom row and to the conductive backsheet to form a complete circuit. The power conversion device can convert the first power output to a second power output characterized by a second voltage that is larger than the first voltage. The power conversion device can also maintain peak power of the PV cells.

25 Claims, 19 Drawing Sheets

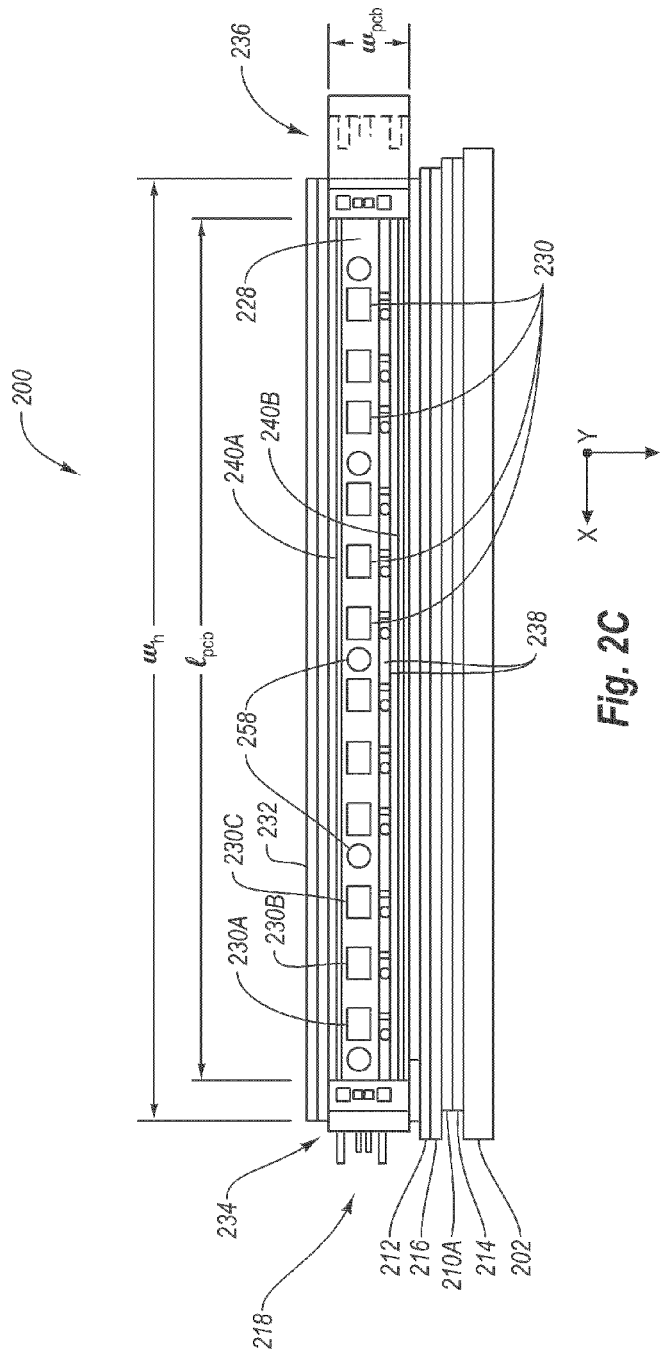
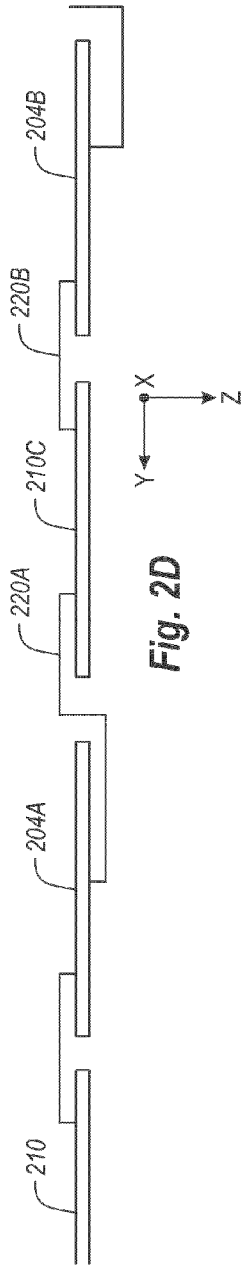
Fig. 2C
Fig. 2D

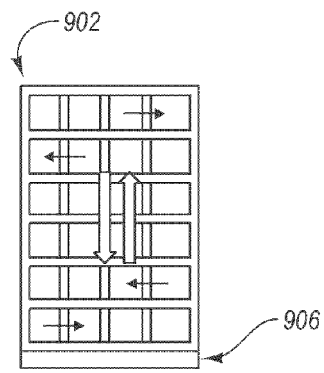
*Fig. 9A*
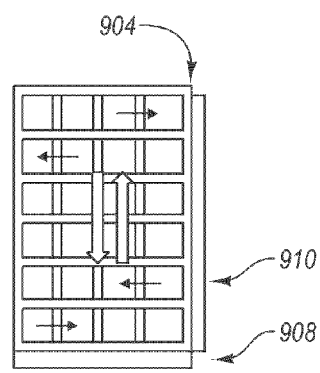
*Fig. 9B*
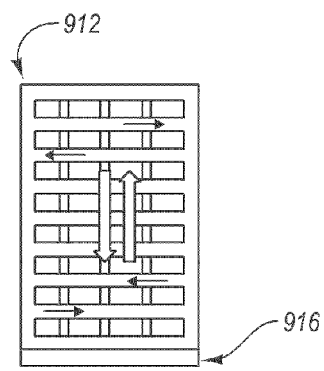
*Fig. 9C*
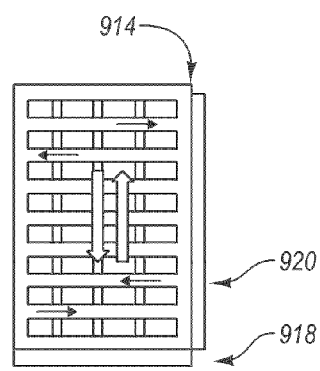
*Fig. 9D*
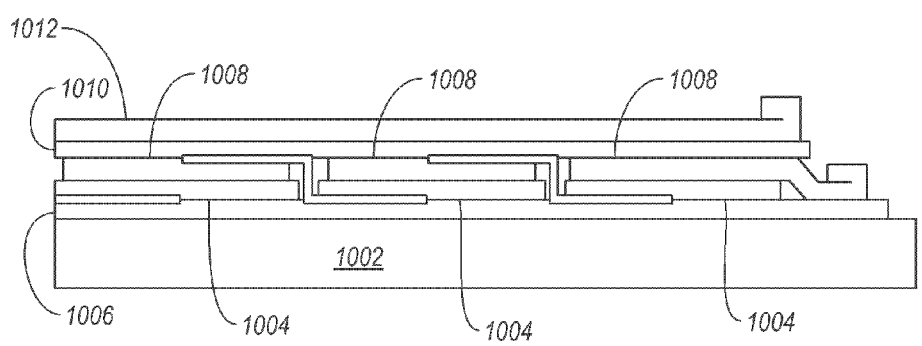
*Fig. 10*
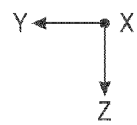

FLAT-PLATE PHOTOVOLTAIC MODULE

CROSS-REFERENCE TO RELATED APPLICATIONS

This patent application:

(i) claims the benefit of and priority to U.S. Provisional Patent Application Ser. No. 61/022,232, filed Jan. 18, 2008 by Dallas W. Meyer for POLISHED AND TEXTURED BACK CONTACTS FOR A THIN-FILM PHOTOVOLTAIC SYSTEM;

(ii) claims the benefit of and priority to U.S. Provisional Patent Application Ser. No. 61/022,264, filed Jan. 18, 2008 by Dallas W. Meyer for A THIN PROTECTIVE FILM FOR PHOTOVOLTAIC SYSTEMS;

(iii) claims the benefit of and priority to U.S. Provisional Patent Application Ser. No. 61/022,253, filed Jan. 18, 2008 by Dallas W. Meyer for A FILM LEVEL ENCAPSULATION PHOTOVOLTAIC SYSTEM;

(iv) claims the benefit of and priority to U.S. Provisional Patent Application Ser. No. 61/022,267, filed Jan. 18, 2008 by Dallas W. Meyer for A PHOTOVOLTAIC SYSTEM WITH EMBEDDED ELECTRONICS;

(v) claims the benefit of and priority to U.S. Provisional Patent Application Ser. No. 61/022,228, filed Jan. 18, 2008 by Dallas W. Meyer for A SINGLE USE DIODE FOR A PHOTOVOLTAIC SYSTEM;

(vi) claims the benefit of and priority to U.S. Provisional patent application Ser. No. 61/022,234, filed Jan. 18, 2008 by Dallas W. Meyer for A HIGHLY COMPLIANT INTERCONNECT FOR A PHOTOVOLTAIC SYSTEM;

(vii) claims the benefit of and priority to U.S. Provisional Patent Application Ser. No. 61/022,236, filed Jan. 18, 2008 by Dallas W. Meyer for A FAULT TOLERANT PHOTOVOLTAIC SYSTEM;

(viii) claims the benefit of and priority to U.S. Provisional Patent Application Ser. No. 61/022,240, filed Jan. 18, 2008 by Dallas W. Meyer for INTEGRATED DEFECT MANAGEMENT FOR THIN-FILM PHOTOVOLTAIC SYSTEMS;

(ix) claims the benefit of and priority to U.S. Provisional Patent Application Ser. No. 61/022,242, filed Jan. 18, 2008 by Dallas W. Meyer for OPERATING FEATURES FOR INTEGRATED PHOTOVOLTAIC SYSTEMS;

(x) claims the benefit of and priority to U.S. Provisional Patent Application Ser. No. 61/022,277, filed Jan. 18, 2008 by Dallas W. Meyer for A PHOTOVOLTAIC SYSTEM USING NON-UNIFORM ILLUMINATION;

(xi) claims the benefit of and priority to U.S. Provisional Patent Application Ser. No. 61/022,278, filed Jan. 18, 2008 by Dallas W. Meyer for LOW MAGNIFICATION CONCENTRATED PHOTOVOLTAIC SYSTEM;

(xii) claims the benefit of and priority to U.S. Provisional Patent Application Ser. No. 61/025,570, filed Feb. 1, 2008 by Dallas W. Meyer for A SELF-DE-ICING PHOTOVOLTAIC SYSTEM;

(xiii) claims the benefit of and priority to U.S. Provisional Patent Application Ser. No. 61/022,245, filed Jan. 18, 2008 by Dallas W. Meyer for A VERY HIGH ASPECT RATIO THIN-FILM PHOTOVOLTAIC SYSTEM;

(xiv) claims the benefit of and priority to U.S. Provisional Patent Application Ser. No. 61/025,575, filed Feb. 1, 2008 by Dallas W. Meyer for PRODUCTION TESTING OF LARGE AREA PHOTOVOLTAIC MODULES;

(xv) claims the benefit of and priority to U.S. Provisional Patent Application Ser. No. 61/022,246, filed Jan. 18, 2008 by Dallas W. Meyer for A LONGITUDINALLY CONTINUOUS PHOTOVOLTAIC MODULE;

(xvi) claims the benefit of and priority to U.S. Provisional Patent Application Ser. No. 61/022,258, filed Jan. 18, 2008 by Dallas W. Meyer for A CONTINUOUS LARGE AREA PHOTOVOLTAIC SYSTEM;

(xvii) claims the benefit of and priority to U.S. Provisional Patent Application Ser. No. 61/022,263, filed Jan. 18, 2008 by Dallas W. Meyer for A BACK-ELECTRODE, LARGE AREA CONTINUOUS PHOTOVOLTAIC MODULE;

(xviii) claims the benefit of and priority to U.S. Provisional Patent Application Ser. No. 61/022,249, filed Jan. 18, 2008 by Dallas W. Meyer for CORRUGATED PHOTOVOLTAIC PANELS;

(xix) claims the benefit of and priority to U.S. Provisional Patent Application Ser. No. 61/022,280, filed Jan. 18, 2008 by Dallas W. Meyer for A VERY HIGH EFFICIENCY THIN-FILM PHOTOVOLTAIC SYSTEM;

(xx) claims the benefit of and priority to U.S. Provisional Patent Application Ser. No. 61/022,252, filed Jan. 18, 2008 by Dallas W. Meyer for A MULTI-USE GROUND BASED PHOTOVOLTAIC SYSTEM;

(xxi) claims the benefit of and priority to U.S. Provisional Patent Application Ser. No. 61/025,578, filed Feb. 1, 2008 by Dallas W. Meyer for A PREDICTIVE SYSTEM FOR DISTRIBUTED POWER SOURCE MANAGEMENT;

(xxii) claims the benefit of and priority to U.S. Provisional Patent Application Ser. No. 61/025,581, filed Feb. 1, 2008 by Dallas W. Meyer for A WEATHERPROOF CORRUGATED PHOTOVOLTAIC PANEL SYSTEM;

(xxii) claims the benefit of and priority to U.S. Provisional Patent Application Ser. No. 61/033,200, filed Mar. 3, 2008 by Dallas W. Meyer for AN ELECTRONICALLY CURRENT BALANCED PHOTOVOLTAIC SYSTEM;

(xxiv) claims the benefit of and priority to U.S. Provisional Patent Application Ser. No. 61/033,203, filed Mar. 3, 2008 by Dallas W. Meyer for A STRUCTURALLY CONTINUOUS PHOTOVOLTAIC CORRUGATED PANEL AND PHOTOVOLTAIC SYSTEM;

(xxv) claims the benefit of and priority to U.S. Provisional Patent Application Ser. No. 61/035,976, filed Mar. 12, 2008 by Dallas W. Meyer for A REDUNDANT SILICON SOLAR ARRAY;

(xxvi) claims the benefit of and priority to U.S. Provisional Patent Application Ser. No. 61/058,485, filed Jun. 3, 2008 by Dallas W. Meyer for A HOME OWNER INSTALLED GROUND OR ROOF MOUNTED SOLAR SYSTEM;

(xxvii) claims the benefit of and priority to U.S. Provisional Patent Application Ser. No. 61/080,628, filed Jul. 14, 2008 by Dallas W. Meyer for A LOW COST SOLAR MODULE;

(xxviii) claims the benefit of and priority to U.S. Provisional Patent Application Ser. No. 61/091,642, filed Aug. 25, 2008 by Dallas W. Meyer for A LOW COST, HIGH RELIABILITY SOLAR PANEL;

(xxix) claims the benefit of and priority to U.S. Provisional Patent Application Ser. No. 61/101,344, filed Sep. 30, 2008 by Dallas W. Meyer for A LARGE AREA LOW COST SOLAR MODULE; and (xxx) claims the benefit of and priority to U.S. Provisional Patent Application Ser. No. 61/111,239, filed Nov. 4, 2008 by Dallas W. Meyer for ENVIRONMENTAL ROBUST ENHANCEMENTS TO RAIS;

(xxxi) claims the benefit of and priority to U.S. Provisional Patent Application Ser. No. 61/119,585, filed Dec. 3, 2008 by Dallas W. Meyer for AN EFFICIENT PHOTOVOLTAIC WALL.

The thirty-one (31) above-identified patent applications are hereby incorporated herein by reference in their entirety.

BACKGROUND

1. Field of the Invention

The present invention relates generally to photovoltaic ("PV") systems. More particularly, embodiments of the present invention relate to a PV module suitable for operation in non-uniform illumination conditions.

2. Related Technology

There are two main types of solar collectors, including silicon and thin films, commonly used in PV modules, the solar collectors commonly composed of PV cells. Silicon is currently the predominant technology, and can generally be implemented as monocrystalline or polycrystalline cells encapsulated behind a transparent glass front plate. Thin film technology is not as wide-spread as silicon technology due to its reduced efficiency, but it is gaining in popularity due to its lower cost.

Currently, the solar energy industry is looking for ways to decrease the cost per unit of energy generated by PV modules. One approach to reducing cost per unit energy is to increase the exposure of the PV module to solar energy over time. For example, the orientation of the PV module relative to the sun can be adjusted throughout the day and/or throughout the year. Changing the orientation of the PV module relative to the sun throughout the day and/or year can require adjustable mounting systems that are costly and/or complicated with parts prone to failure over the lifetime of the PV module.

Another approach to reducing the cost per unit energy of a PV module is to reduce the solar collector density of the PV module and concentrate solar energy incident on the PV module on the remaining solar collectors. However, conventional PV modules are typically very sensitive to and perform poorly under non-uniform illumination conditions that can be associated with reflector systems.

Additionally, conventional PV modules sometimes incorporate one or more electronic devices, such as power inverters, with the PV module. Power inverters and other electronic devices incorporated with conventional PV modules are usually sized and shaped such that the electronic device is mounted to the backside of the PV module. As a result, flying leads are required to connect the electronic device to the PV module. The power inverters and other electronic devices can also add significant cost to the PV module and are prone to failure Alternately or additionally, the electronic devices employed in conjunction with PV modules can have high power requirements, e.g. on the order of 1000s of watts, with leads carrying up to 600 volts which can represent a significant safety hazard for residential use. Typically, these types of high-power electronic components and devices are in relatively low demand in the world-wide electronics market compared to consumer electronics and are not mass-produced. Instead, these high-power electronic devices may comprise specialized electronic devices sold in low volumes at relatively high costs and low reliability. The high cost of the electronic devices employed with PV modules can represent a significant factor in the total cost of a PV system.

The subject matter claimed herein is not limited to embodiments that solve any disadvantages or that operate only in environments such as those described above. Rather, this background is only provided to illustrate one exemplary technology area where some embodiments described herein may be practiced

BRIEF SUMMARY OF SOME EXAMPLE EMBODIMENTS

In general, example embodiments of the invention relate to PV modules suitable for operation in non-uniform illumination conditions.

One example embodiment includes a PV module comprising a conductive backsheet, a non-conductive layer disposed on the conductive backsheet, a plurality of PV cells arranged in rows and collectively generating a first power output characterized by a first voltage, and a power conversion device. Each of the rows can include two or more PV cells. The PV cells within each row can be connected to each other in parallel. The rows can be connected in series. A top row can be connected to the conductive backsheet. The power conversion device can be redundantly connected to a bottom row and to the conductive backsheet to form a complete circuit. The power conversion device can convert the first power output to a second power output characterized by a second voltage that is larger than the first voltage. The power conversion device can also track and maintain peak power of the PV cells.

Another example embodiment includes a PV system comprising a PV module and a plurality of louvers. The PV module can include a conductive backsheet, a substantially transparent front plate, a plurality of PV cells, a plurality of conductive spacers, and a power conversion device. The PV cells can be disposed between the conductive backsheet and the front plate. Additionally, the PV cells can be arranged in a plurality of rows, the PV cells in each row being connected in parallel and the rows being connected in series. The spacers can be interposed between the PV cells and can include a top spacer and a bottom spacer. The top spacer can interconnect a top row to the conductive backsheet. The power conversion device can be redundantly connected to a bottom row via the bottom spacer and to the conductive backsheet to form a complete circuit. The louvers can be positioned above the spacers and the front plate and can reflect solar radiation incident on the louvers onto the PV cells.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 2A-2E disclose aspects of an example PV module that can include a redundantly connected power conversion device;

FIGS. 9A-9D disclose a variety of fully-populated and sparsely-populated PV modules;

FIG. 10 discloses a cross-sectional view of an example fully-populated PV module.

DETAILED DESCRIPTION OF EXAMPLE EMBODIMENTS

Embodiments of the invention are generally directed to a PV module that can operate under non-uniform illumination conditions. Some example embodiments can include PV modules comprising multiple rows of PV cells. The PV cells within each row can be connected to each other in parallel, while the rows are connected to each other in series. The PV module can also include a power conversion device redundantly connected in series to the array of PV cells. The power conversion device can provide power conditioning for the array of PV cells. The principles of the invention can allow PV module embodiments disclosed herein to be operated under highly non-uniform illumination conditions without substantially limiting the output power of the PV module.

I. Example Operating Environments

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Figure 1A:
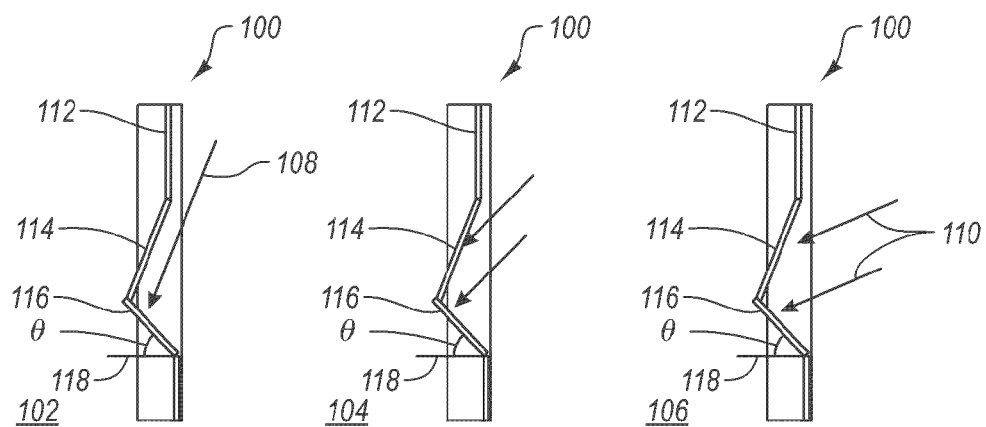
FIGS. 1A and 1B disclose two example operating environments that can include non-uniform illumination.

Turning first to FIG. 1A, one example of an operating environment 100 depicted at three different time periods 102, 104, 106 of the year is disclosed that may include non-uniform illumination conditions. Each of the time periods 102, 104, 106 may correspond to, respectively, summer, spring, and winter. Alternately or additionally, the time period 104 can correspond to fall.

The operating environment 100 can include virtually any non-equatorial location in the Northern or Southern Hemisphere. In this and other embodiments described herein, it will be assumed that the location is in the Northern Hemisphere. However, the principles of embodiments of the invention are equally applicable in the Southern Hemisphere.

Due to the fact that the Earth's axis of rotation through the North and South Poles is tilted, e.g. not perpendicular, relative to its orbital plane about the Sun, the angle of incoming light rays from the Sun at a given location on the Earth changes from season to season. Accordingly, incoming light rays 108 in the summer time period 102 generally arrive at Earth from more directly overhead than incoming light rays 110 in the winter time period 106. Note that, as used herein, the term light rays is to be broadly construed as any type of electromagnetic radiation, such as solar radiation, including visible light and infrared ("IR") radiation, that can be converted by a PV cell into electrical energy.

The operating environment 100 can include a structure 112 comprising one or more reflective materials 114 and one or more PV modules 116 according to embodiments of the invention. The reflective material 114 and PV module 116 can be disposed in a wall of the structure 112. In some embodiments, the structure 112 can comprise a building having one or more walls or other surfaces in which the reflective material 114 and PV module 116 are disposed.

In this example, the reflective material 114 can comprise a glass window treated to discriminately filter solar radiation depending on the wavelength of the radiation. For instance, the reflective material 114 may allow solar radiation in the form of visible light, or radiation having a wavelength from about 380 nm to about 750 nm, to be transmitted through the reflective material 114, while reflecting solar radiation in the form of IR radiation, or radiation having a wavelength from about 750 nm to about 1 mm. In some cases, the reflected radiation can impinge on the PV module 116. Accordingly, in some embodiments, the reflective material 114 can allow visible light to pass through the reflective material 114, while reflecting IR radiation onto the PV module 116.

In other embodiments of the invention, the structure 112 can comprise a wall, one or more columns, or some other structure. Alternately or additionally, the reflective material 114 can be configured to reflect all or a portion of the incident solar radiation and can comprise reflective materials other than treated glass, such as aluminum, sheet metal, white rocks, snow, ice, water, or the like.

In Northern Hemisphere installation sites, the PV module 116 can be installed on generally south-facing walls of the structure 112. Alternately, in Southern Hemisphere installation sites, the PV module 116 can be installed on generally north-facing walls of the structure 112.

Further, the PV module 116 can be installed in orientations that are aligned or not aligned to the sun. In particular, in both orientations, the PV module 116 can be installed at an angle θ relative to a horizontal reference plane 118. In an orientation aligned to the sun ("aligned orientation"), the value of the angle θ can be substantially equal to the latitude of the installation site, within ±3 degrees. However, in an orientation not aligned to the sun ("non-aligned orientation"), the value of the angle θ can be at least 3 degrees greater or less than the latitude of the installation site.

According to some embodiments of the invention, the PV module 116 can be configured to operate under non-uniform illumination conditions. Note that, as used herein, the term "non-uniform illumination condition" is to be broadly construed to include both actual non-uniform illumination conditions as well as virtual non-uniform illumination conditions.

"Actual non-uniform illumination conditions" include instances where one or more PV cells of the PV module 116 receive illumination that is more or less intense than one or more other PV cells of the PV module 116. For instance, bird excrement, snow, and/or other debris can accumulate on the front of the PV module 116 such that the areas covered by the debris are partially or completely blocked from receiving illumination. In this case, the illumination intensity of the PV cells not covered by the debris can generally be greater than the illumination intensity of the PV cells covered by the debris.

As another example, one or more objects can be temporarily or permanently disposed between the sun and the PV module 116, such that the objects cast a shadow on one or more, but not all, of the PV cells of the PV module 116. Such objects can include birds and other animals, trees, buildings, and/or architectural or other features of the structure 112 itself that are interposed between the sun and the PV module 116 at certain times of day. In this example, PV cells that are shaded can generally be exposed to less intense illumination than PV cells that are exposed directly to the sun.

As yet another example, in some embodiments, reflected illumination can be concentrated more on some areas of the PV module 116 than on other areas of the PV module 116. For instance, the reflective material 114 may concentrate reflected IR and/or other radiation on a first set of PV cells of the PV module 116 but not on a second set of PV cells of the PV module 116. In this case, both of the first and second sets of PV cells can be receiving direct radiation from the sun, with the added reflected radiation on the first set of PV cells resulting in increased illumination intensity on the first set of PV cells. Further, in some embodiments, the first set of PV cells receiving the reflected radiation from reflective material 114 may change throughout the day and/or year depending on the angle of incidence of the incoming radiation.

"Virtual non-uniform illumination conditions" include instances where one or more PV cells of the PV module 116 behave as if they were receiving illumination that is more or less intense than one or more other PV cells, even though the illumination is substantially uniform in reality. For instance, one or more PV cells of PV module 116 can be an underperforming PV cell and/or can fail during PV module 116 operation due to manufacturing defects such as interconnect failures, or other problem(s). In this example, the underperforming and/or failed PV cell can operate the same as if it were subject to less intense illumination than the surrounding PV cells. As such, the presence of an underperforming and/or failed cell in the PV module 116 can be viewed as a virtual non-uniform illumination condition.

Figure 1B:
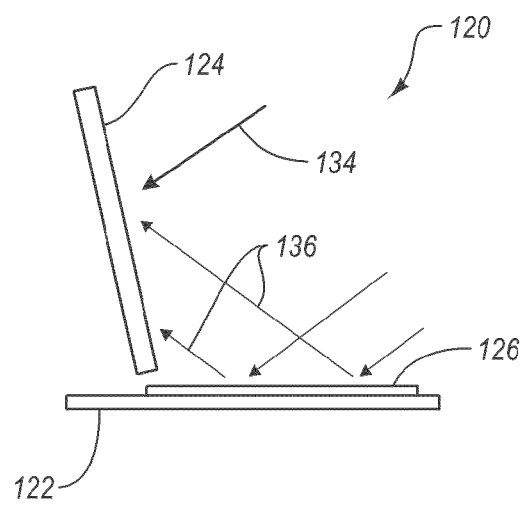

Turning next to FIG. 1B, another example operating environment 120 is disclosed that may include non-uniform illumination conditions. The operating environment 120 can include a surface 122 upon which a PV module 124 and one or more reflective materials 126 can be disposed. The PV module 124 can include a plurality of rows of PV cells, the rows being arranged substantially vertically within the PV module 124 relative to the surface 122. The surface 122 may comprise the surface of the ground at an installation site, or some other surface.

The reflective material 126, in some embodiments, can include an aluminized wrapper approximately six feet by six feet square that can be highly wrinkled or smooth. Alternately or additionally, the reflective material 126 can include eight unpolished aluminum strips approximately one inch by six feet in some embodiments. In other embodiments, the reflective material 126 can comprise materials other than, or in addition to, aluminum, including polished or unpolished aluminum, sheet metal, highly reflecting metal-based films or alternating index laminate films bonded to a substrate such as aluminum, rocks, ice, snow, water, or the like. Further, the reflective material 126 can have dimensions other than six feet by six feet square, or one inch by six feet.

The PV module 124 can be mounted to or leaning against the side of a building or other object such as a fence. Further, the PV module 124 can be configured to operate under non-uniform illumination conditions according to embodiments of the invention. The PV module 124 can receive solar radiation directly from the sun, or solar radiation that has been reflected off of the reflective material 126 or some other objects first. The reflection of solar radiation off of the reflective material 126 onto the PV module 124 can result in non-uniform illumination across the PV module 124. For instance, when the reflective material 126 comprises a highly wrinkled aluminized wrapper, the wrinkles can concentrate reflected radiation onto specific areas of the PV module 124.

Figure 1C:
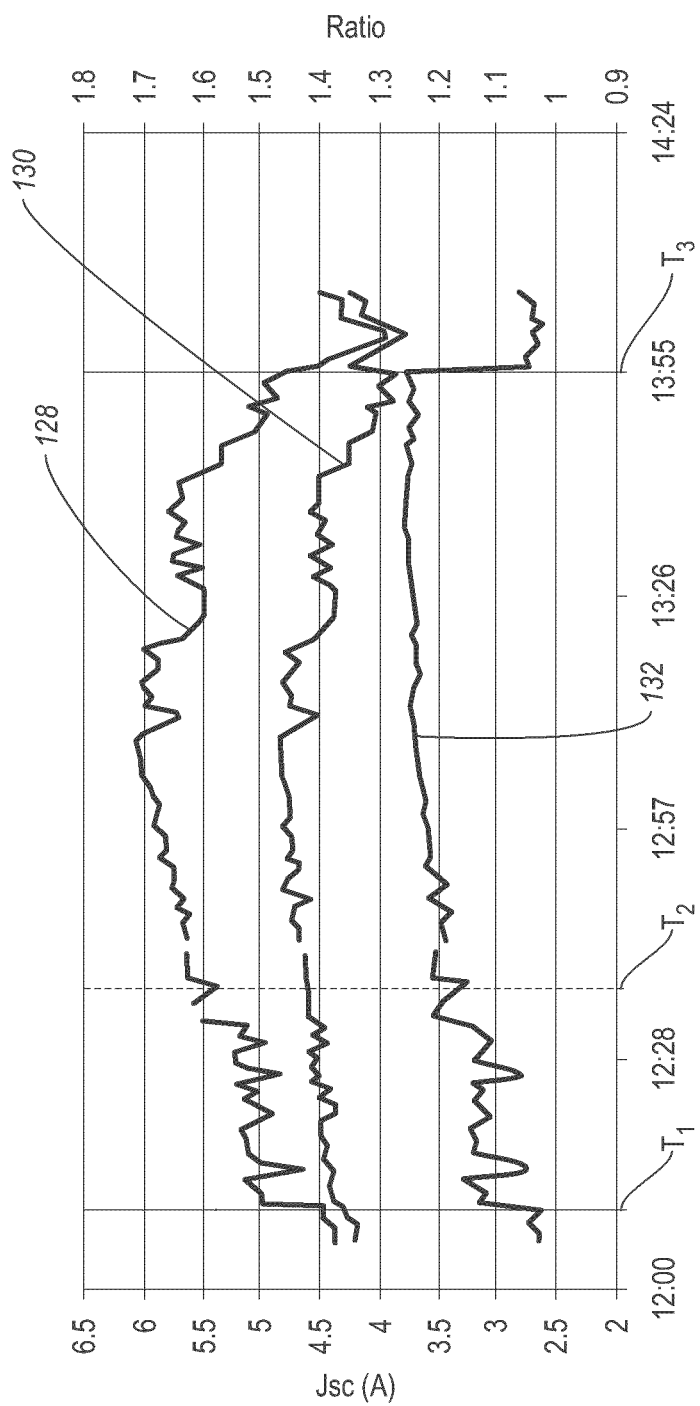
FIG. 1C is a graphical representation of the performance of various PV modules receiving non-uniform illumination.

FIG. 1C is a graphical representation of the performance of PV module 124 compared to a conventional PV module under non-uniform illumination conditions such as may exist in the operating environment 120 of FIG. 1B. Curve 128 includes data for the PV module 124, curve 130 includes data for the conventional PV module, and curve 132 is a ratio of curve 128 to curve 130. The x-axis of FIG. 1C can represent the time of day, beginning at about 12:00 pm and ending at about 2:24 pm on Nov. 21, 2008. The left y-axis can represent the short circuit current Jsc of the PV module 124 and conventional PV module as a function time. The right y-axis can represent the Jsc ratio of PV module 124 to the conventional PV module.

In the example of FIG. 1C, each of the PV module 124 and the conventional PV module were positioned side-by-side leaning against a wall, such that each could receive substantially uniform radiation directly from the sun, including light ray 134. At time $T_1$, or about 12:10 pm, reflective material 126 comprising a six foot by six foot highly wrinkled aluminized wrapper was placed on the ground in front of the PV module 124. At time $T_2$, or about 12:38 pm, additional reflective material 126 comprising eight unpolished aluminum strips approximately one inch by six feet were also placed on the ground in front of the PV module 124. At time $T_3$, or about 1:55 pm, the reflective material 126 was moved to a position in front of the conventional PV module. The reflective material 126 allowed the PV module 124 or the conventional PV module to receive non-uniform reflected illumination from the reflective material 126, including reflected light rays 136.

Prior to time $T_1$, when both PV module 124 and the conventional PV module were exposed only to uniform radiation directly from the sun, PV module 124 was generating slightly more Jsc than the conventional PV module, at a Jsc ratio of about 1.044. From $T_1$ to about $T_3$ when the PV module 124 was receiving additional non-uniform illumination from the reflective material 126 and the conventional PV module was only receiving uniform radiation from the sun, the Jsc ratio ranged from about 1.05 to about 1.25. After $T_3$ when the PV module 124 was only receiving uniform illumination from the sun and the conventional PV module was receiving additional non-uniform illumination from the reflective material, the Jsc ratio dropped to about 1.04 again.

Accordingly, the presence of non-uniform illumination on PV module 124 from $T_1$ to $T_3$ actually increased the efficiency of the PV module 124, while the presence of non-uniform illumination on the conventional PV module after $T_3$ had little effect on the conventional PV module.

Figure 1D:
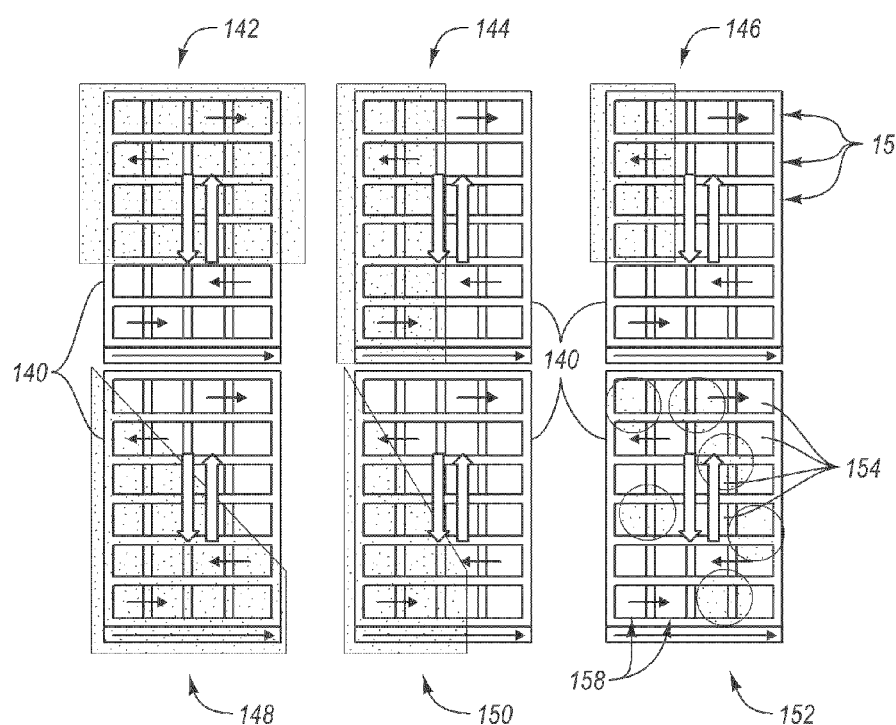
FIG. 1D discloses different example non-uniform illumination conditions.

FIG. 1D discloses front views of a PV module 140 under six example non-uniform illumination conditions, denoted 142, 144, 146, 148, 150, and 152. As shown, the PV module 140 in each of non-uniform illumination conditions 142-152 can include a plurality of PV cells 154 generally arranged in rows 156 and columns 158. The non-uniform illumination conditions 142-152 disclosed in FIG. 1D are merely meant to illustrate some examples of non-uniform illumination conditions and should not be construed to limit the invention.

II. First Example Photovoltaic Module

Figure 2A:
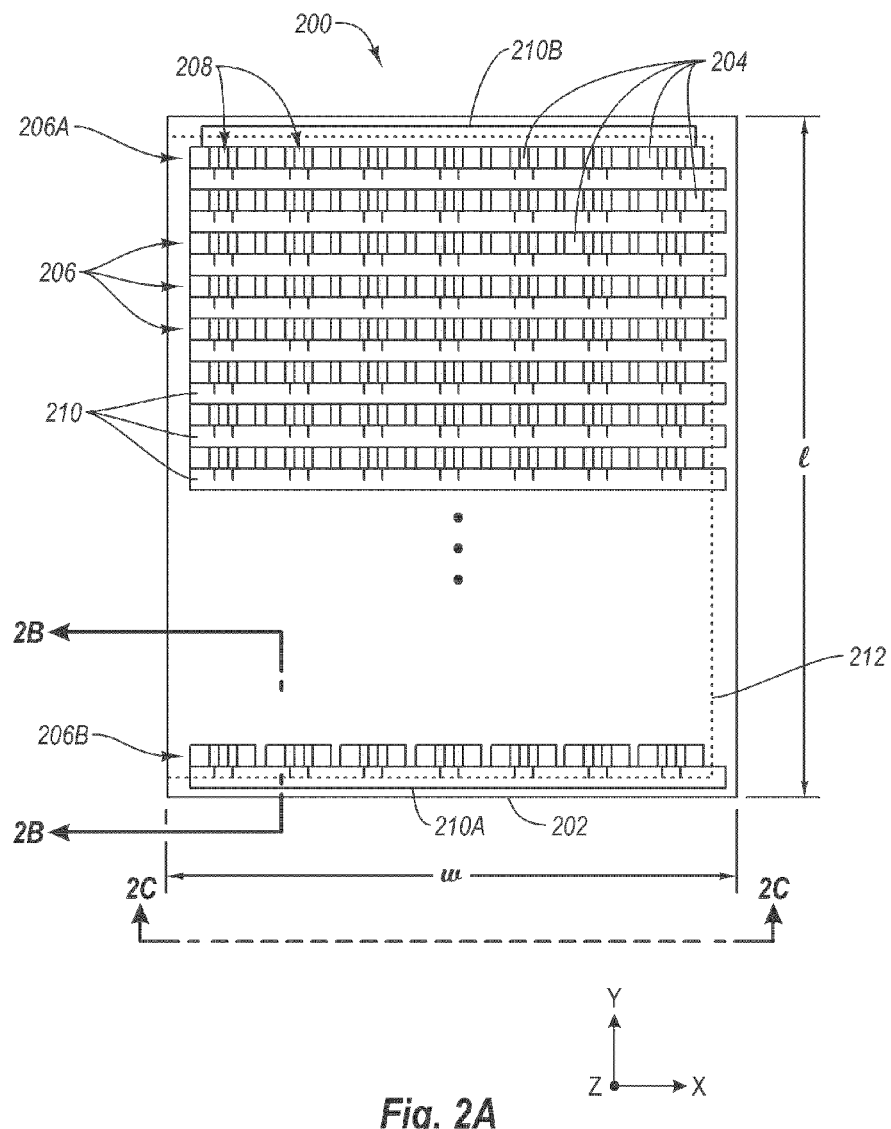
Figure 2B:
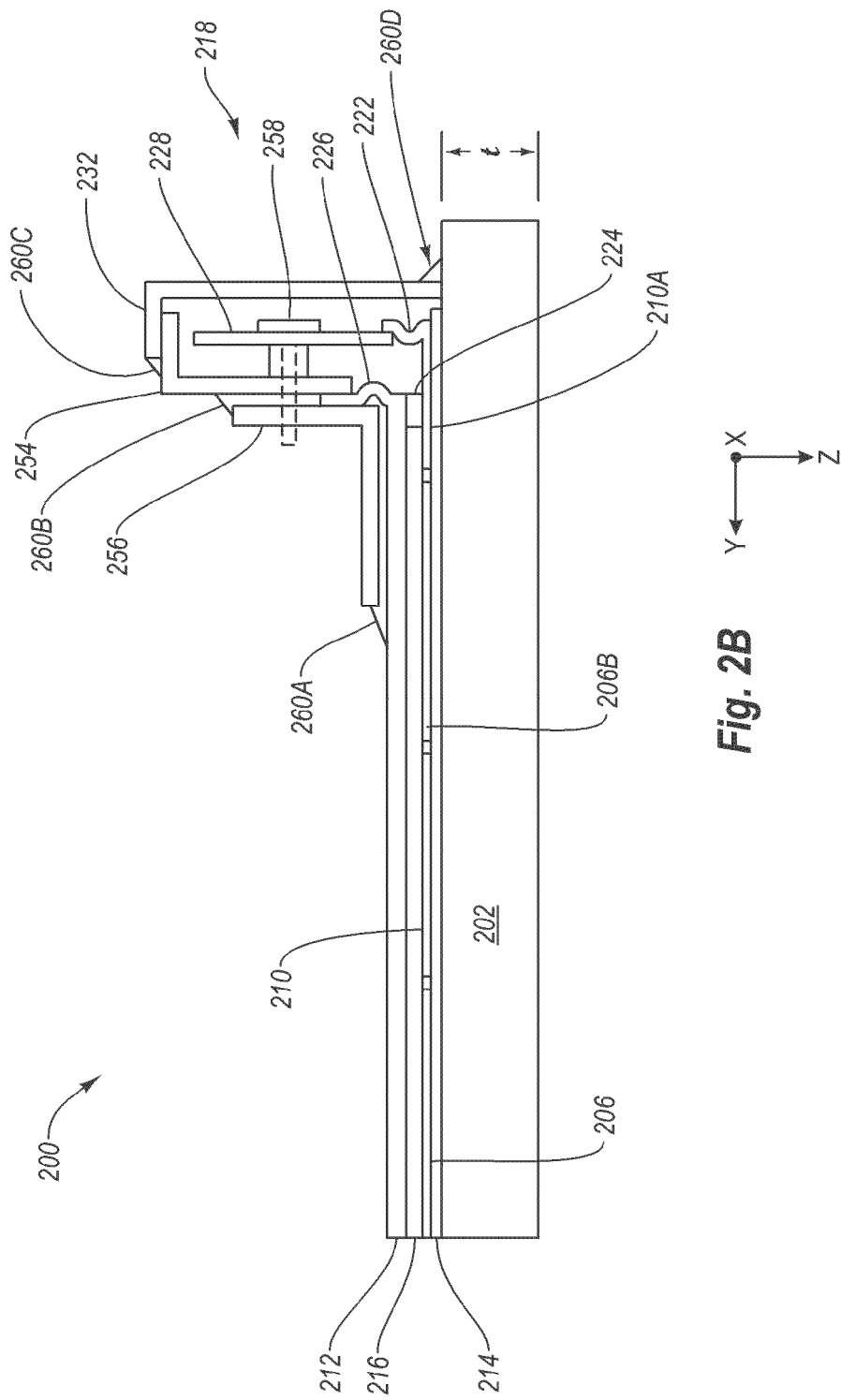

Turning next to FIGS. 2A-2C, a first example PV module 200 is disclosed that may correspond to the PV modules 116, 124, 140 of FIGS. 1A-1D. FIGS. 2A-2C depict, respectively, a front view, a cross-sectional view, and an end view of the PV module 200 in simplified form. With reference first to FIG. 2A, the PV module 200 can comprise a front plate 202, a plurality of PV cells 204 disposed beneath the front plate 202 that can be arranged in rows 206 and columns 208, a plurality of spacers 210 that the rows 206 can be interconnected between, and a backsheet 212.

With additional reference to FIGS. 2B and 2C, the PV module 200 can further include an adhesive layer 214 disposed between the front plate 202 and the rows 206 of PV cells 204, a buffer layer 216 disposed between the rows 206 of PV cells 204 and the backsheet 212, and a power conversion device 218 redundantly connected in series to the rows 206 via bottom spacer 210A at the bottom of the PV module 200.

The front plate 202 may comprise a substrate that is substantially transparent to solar radiation, such as glass, plastic, or the like, upon which the other layers of the PV module 200 can be grown or otherwise placed during manufacture of the PV module 200. The front plate 202 may protect the PV cells 204 from damage due to environmental factors, including moisture, wind, and the like. The substantially transparent nature of the front plate 202 with respect to solar radiation can allow light rays to penetrate through the front plate 202 and impinge upon the PV cells 204. Alternately or additionally, the front plate 202 can provide structural support to the PV cells 204.

In some embodiments, the front plate 202 can be characterized by a length l (FIG. 2A), a width w (FIG. 2A) and a thickness t (FIG. 2B). The length l, width w and thickness t can be approximately 1830.5 mm, 947 mm, and 3.2 mm, respectively. Alternately or additionally, the length l, width w and thickness t can be more or less than 1830.5 mm, 947 mm, and 3.2 mm, respectively.

The adhesive layer 214 can be configured to secure the front plate 202 to the PV cells 204. Further, the adhesive layer 214 may comprise ethylene-vinyl acetate ("EVA"), or other suitable adhesive. In some embodiments, the adhesive layer 214 can be 2-4 mils thick, or more or less than 2-4 mils thick in other embodiments. The adhesive layer 214 may be substantially transparent to solar radiation to allow light rays to reach the PV cells 204. Alternately or additionally, the adhesive layer 214 can be treated so as to substantially prevent ultraviolet ("UV") damage and/or yellowing of the adhesive layer 214.

The buffer layer 216 can be configured to secure the backsheet 212 to the PV cells 204 and to electrically insulate the PV cells 204 from the backsheet 212. As such, the buffer layer 216 can comprise an adhesive such as EVA, an electrically insulating material such as polyethylene terephthalate ("PET"), or the like or any combination thereof. The buffer layer 216 may be a non-conductive layer. In some embodiments, the buffer layer 216 can be about 3 mils thick, or more or less than 3 mils thick.

Generally speaking, the PV cells 204 can convert solar energy into electricity by the photovoltaic effect. In some embodiments, all of the PV cells 204 in a given row 206 are connected to each other in parallel, while the rows 206 are connected to each other in series. The PV cells 204 may be collectively referred to herein as "PV cell array 204."

Each of the PV cells 204 may comprise a monocrystalline solar cell or a polycrystalline solar cell. Alternately or additionally, strips of PV material, such as amorphous silicon or CIGS, can be implemented in the PV module 200 in place of individual cells 204. The PV cells 204 or other PV material implemented in PV module 200 can include silicon, copper, indium, gallium, selenide, or the like or any combination thereof.

Each row 206 and each column 208 can respectively include seven or fifteen PV cells 204, or more or less than seven or fifteen PV cells 204. Accordingly, the PV module 200 can include 105 PV cells 204 in some embodiments, or more or less than 105 PV cells 204. Further, each of the PV cells 204 can be configured to individually generate a voltage of approximately 0.6 volts and a current that varies with illumination intensity, but that may be anywhere between 2.5-10 amps under 1 sun of illumination. With the PV cells 204 within each row 206 connected in parallel and the rows 206 connected in series, PV cell array 204 may generate a voltage of about 9 volts and a current that varies with illumination intensity, but that may be anywhere between 25-60 amps under 1 sun of illumination in some embodiments. Alternately or additionally, PV cell array 204 can generate a voltage between 3-12 volts and a current less than 25 amps or more than 60 amps.

In some embodiments of the invention, the above-described configuration of the PV module 200 can allow the PV module 200 to be implemented without bypass diodes or other protective devices for the PV cells 204 in the case of a blocked PV cell 204 or blocked row 206. In particular, the maximum voltage across any of the PV cells 204 can be less than 10 volts, such as 9 volts as described above. In this case, if one of the rows 206 is blocked, e.g. due to one or more faulty PV cells 204 in the blocked row or due to non-uniform illumination across the blocked row, a maximum of 9 volts can be dissipated across the blocked row 206. However, the PV cells 204 implemented in PV module 200 can generally withstand 9 volts being dissipated through the PV cells 204.

In contrast, in conventional PV modules, the PV cells can be serially connected in a string of 20 PV cells or more. As a result, the maximum voltage across the PV cells in a conventional PV module can reach up to 600 volts, which can be damaging to blocked PV cells. Thus, some conventional PV modules can require bypass diodes and/or other protective devices to allow power to be routed around blocked PV cells so as to avoid damaging the blocked PV cells. Furthermore, failure of the bypass diodes to operate properly may result in a fire due to PV cell failure.

A. Spacers

Returning to FIGS. 2A-2C, each of the spacers 210 can comprise an electrically conductive material, such as aluminum, copper, or the like, formed in solid strips in some embodiments. The spacers 210 can each be approximately 2-8 mils thick, 62.5 mm wide, and 888 mm long in some embodiments, and/or can have different dimensions than those stated. In some examples, the spacers 210 can include a bottom spacer 210A disposed after last row 206 and/or a top spacer 210B disposed before first row 206, the bottom spacer 210A and/or top spacer 210B being shorter in length than the other spacers 210 disposed between bottom spacer 210A and top spacer 210B.

In some cases, the spacers 210 can be stamped, etched or otherwise patterned to form anisotropic conductivities within each of the spacers 210. Anisotropic conductivities within the spacers 210 can allow current flow between rows 206 to be controlled and managed in a predetermined manner according to a desired application. Each of the spacers 210 can include solid copper, patterned copper, solid aluminum, or patterned aluminum.

In some embodiments, the spacers 210 can be implemented in the electrical interconnections between adjacent rows 206 of PV cells 204. For example, FIG. 2D depicts a cross-section of two PV cells 204A and 204B from adjacent rows 206 and a spacer 210C interconnected and interposed in between. As shown, a positive terminal of PV cell 204A can be coupled to the spacer 210C via busbar 220A, while a negative terminal of PV cell 204B can be coupled to the spacer 210C via busbar 220B. All of the PV cells 204 in each row 206 can similarly be coupled to the spacers 210, with the positive terminal of every PV cell 204 in a given row 206 being coupled to one spacer 210 adjacent to the row 206, and the negative terminal of every PV cell 204 in the row 206 being coupled to the other adjacent spacer 210, such that all the PV cells 204 in the row 206 are coupled in parallel to each other via the two spacers 210 on adjacent sides of the row 206. Optionally, the busbars 220A and 220B (collectively "busbars 220") coupled to each spacer 210 can be arranged such that the busbars 220 are coupled to a back side of the spacers 210.

Optionally, the spacers 210 can have an emissive coating applied to the front side or to the front and back sides of the spacers 210. The emissive coating can have an emissivity greater than 0.6 so as to enable the spacers 210 to aid in thermal management of the PV module 200. For example, due to the proximity of the spacers 210 to the PV cells 204, heat generated by the PV cells 204 can be conductively transferred from the PV cells 204 to the spacers 210, whereupon the emissive coating applied to the spacers 210 can allow the spacers 210 to efficiently radiate the heat away from the PV module 200. The emissive coating can comprise black anodizing, black paint, laminated black PET, or other organic film with dark pigmentation or filler material, or the like or any combination thereof.

As seen in FIG. 2A, one or more of the spacers 210A and 210B can extend beyond the bottom and top edges of backsheet 212. More particularly, the bottom spacer 210A can extend beyond the bottom edge of backsheet 212 in the negative y-direction, and/or the top spacer 210B can extend beyond the top edge of backsheet 212 in the positive y-direction. In some embodiments, the power conversion device 218 can be redundantly coupled to the bottom spacer 210A via the portion of the bottom spacer 210A extending beyond the backsheet 212. Alternately or additionally, the backsheet 212 can be coupled to the bottom spacer 210A via power conversion device 218 and directly to the top spacer 210B to form a current return path for the PV cell array 204. In this embodiment and other embodiments, a top row 206A can be electrically connected directly to the backsheet 212 via the top spacer 210B, while a bottom row 206B can be electrically connected to the backsheet 212 via power conversion device 218.

A cross-sectional view of the portion of the bottom spacer 210A extending beyond the bottom edge of backsheet 212 can be seen in FIG. 2B. As seen in FIG. 2B, the portion of the bottom spacer 210A extending beyond the bottom edge of backsheet 212 can include a stress-relief fold 222 formed in the bottom spacer 210A and interconnecting the bottom spacer 210A and the rows 206 to the power conversion device 218 in series. During operation of the PV module 200, the temperature of the PV module 200 can vary through a spectrum of temperatures. The temperature variance can cause the front plate 202 to bow in some instances, which can put a strain on the adhesives and other components coupling the power conversion device 218 to the rest of the PV module 200. However, the stress-relief fold 222 can substantially reduce and/or eliminate the strain at the junction of the power conversion device 218 with the PV module 200 by bending and/or flexing as needed to accommodate bowing of the front plate 202. The stress-relief fold 222 can be formed in the bottom spacer 210A by bending or folding the bottom spacer 210A and/or can include a soldered or clipped interconnect between the bottom spacer 210A and the power conversion device 218.

Alternately or additionally, one or more of the spacers 210 can extend beyond a side edge of the backsheet 212. For example, each of the spacers 210 except for the bottom spacer 210A and the top spacer 210B can extend beyond the side edge of the backsheet 212 in the positive x-direction. In some embodiments, one or more electronic devices, such as a plurality of bypass diodes and/or an active row-balancing device, or the like, can be coupled to the spacers 210 via the portion of each spacer 210 extending beyond the backsheet 212 in the positive x-direction.

B. Backsheet

In some embodiments, the PV cells 204 can be sealed within a protective enclosure comprising the front plate 202 and the backsheet 212. The protective enclosure can operate to substantially prevent exposure of the PV cells 204 to moisture and/or other environmental factors. Optionally, the protective enclosure can further include a sealant material 224, shown in FIG. 2B, along the bottom edge of the backsheet 212 between the backsheet 212 and the spacer 210A. The sealant material 224 can form a seal between the backsheet 212 and the bottom spacer 210A and can electrically insulate the backsheet 212 from the bottom spacer 210A. In some embodiments, the sealant material 224 can comprise an acrylic-based foam tape, solar edge tape, or other suitable material(s).

As already mentioned above, the backsheet 212 can be implemented to form a current return path for the PV cell array 204. More particularly, the backsheet 212 can be coupled to the top row 206A via top spacer 210B and to the bottom row 206B via spacer 210A and power conversion device 218 to form a current return path for the PV cell array 204. As such, in some embodiments, the backsheet 212 can comprise a sheet of conductive material, including one or more of aluminum, copper, sheet metal, stainless steel, or other suitable material(s). Alternately or additionally, the backsheet 212 can be approximately 2-8 mils thick and of sufficient width and length to cover all of PV cells 204. Alternately or additionally, the dimensions of the width and length of the backsheet 212 can allow at least some portions of one or more of the spacers 210 to extend beyond one or more of the top, bottom, or side edges of the backsheet 212.

In some embodiments of the invention, the back of backsheet 212, e.g. the negative z-side of backsheet 212, can have a high emissivity of at least 0.6 or higher. The high emissivity can be provided via an emissive coating applied to the back of backsheet 212. In this example, the backsheet 212 can operate to radiate heat generated by the PV cells 204 away from the back of PV module 200 and/or to melt snow and/or ice that can accumulate on the front of PV module 200.

For example, with reference to FIG. 2B, at times, such as in the summertime and other times, heat generated by the rows 206 of PV cells 204 can be conductively transferred from the rows 206 of PV cells 204 to the backsheet 212. In turn, when the back of backsheet 212 is highly emissive, the heat can be radiated away from the back of backsheet 212 and PV module 200 via a highly emissive coating on the backsheet 212.

At other times, such as in the winter time and other times, snow and/or ice can accumulate on the front of PV module 200 and on areas beneath and around PV module 200. In this case, the accumulated snow and ice on the front of the PV module 200 can block all or a portion of the PV module 200 from being illuminated. However, whereas snow and ice can reflect a significant amount of light rays, the snow and/or ice on the areas beneath and around the PV module 200 can reflect at least some light rays towards the back of backsheet 212. The energy of the reflected light rays that impinge on the backsheet 212 can be absorbed as heat that can be conductively transferred from the backsheet 212 to the rows 206 of PV cells 204 and to the front plate 202, eventually causing snow and/or ice on the front of the PV module 200 to melt.

As seen in FIG. 2B, the backsheet 212 can include a stress-relief fold 226 formed at the bottom edge of backsheet 212 and interconnecting the backsheet 212 to the power conversion device 218. As explained above with respect to the stress-relief fold 222 of bottom spacer 210A, the temperature of the PV module 200 can vary through a spectrum of temperatures during operation, which can cause the front plate 202 to variably bow in some instances. The bowing of the front plate 202 can strain adhesives and other components coupling the power conversion device 218 to the rest of PV module 200. However, the stress-relief fold 226 of backsheet 212 can substantially reduce and/or eliminate the strain at the junction of the power conversion device 218 with the PV module 200 by bending and/or flexing as needed to accommodate bowing of the front plate 202. The stress-relief fold 226 can be formed in the backsheet 212 by bending or folding the backsheet 212 and/or can include a soldered or clipped interconnect between the backsheet 212 and the power conversion device 218.

As will be explained in greater detail below, the PV module 200 can include a mechanical connection, electrical ground connection and/or thermal connection between the backsheet 212 and the power conversion device 218. The mechanical connection, electrical ground connection and/or thermal connection can comprise one or more of: structural tape, electrically conducting tape, thermally conductive silicon sealant, direct mechanical contact between the stress-relief fold 226 of backsheet 212 and power conversion device 218, mechanical fasteners, or the like or any combination thereof C. Power Conversion Device Some aspects of the power conversion device 218 are disclosed in FIGS. 2B, 2C and 2E. As shown, the power conversion device 218 can comprise a printed circuit board ("PCB") 228, one or more power conversion circuits 230 (FIG. 2C), and a first housing 232. Alternately or additionally, the power conversion device 218 can include a first connector 234 and a second connector 236 that is complementary to the first connector 234. In some embodiments of the invention, the power conversion circuits 230 can be powered by power output from the PV cell array 204.

1. Printed Circuit Board

The PCB 228 can have a length $l_{pcb}$ of 891 mm, or the length $l_{pcb}$ can be greater than or less than 891 mm. The PCB 228 can further have a width $w_{pcb}$ that can be on the order of 20 to 40 times smaller than the length $l_{pcb}$ of the PCB 228, such that the PCB 228 has a length-to-width aspect ratio between 20:1 and 40:1. Alternately or additionally, the width $w_{pcb}$ of the PCB 228 can be less than 20 times smaller or more than 40 times smaller than the length $l_{pcb}$ such that the length-to-width aspect ratio of PCB 228 is less than 20:1 or greater than 40:1.

The size and 20:1-40:1 aspect ratio of the PCB 228 in some embodiments can allow the PBC 228 to be mounted along an edge of the PV module 200, such as along the bottom edge of PV module 200, allowing the PCB 228 to be redundantly connected to the bottom spacer 210A or to some other electrical interconnect between the PV cell array 204 and the PCB 228. Alternately or additionally, the mounting of the PCB 228 along the bottom edge of PV module 200 can allow the PCB 228 to be directly connected to the bottom spacer 210A without the use of flying leads.

The PCB 228 can be disposed substantially orthogonal to the backsheet 212. Alternately or additionally, the PCB 228 can be disposed substantially parallel to the backsheet 212.

Although not shown in FIGS. 2B-2C, the PCB 228 can include one or more control modules, such as a digital controller, microcontroller, processor, microprocessor, or the like, that can be disposed on the PCB 228 and can be configured to control operation of the power conversion circuits 230. Alternately or additionally, each power conversion circuit 230 can include a control module. In some embodiments, the control modules can communicate with each other and/or with the power conversion circuits 230 via digital leads 238 formed in the PCB 228. The digital leads 238 can comprise differential or single-ended digital leads.

The PCB 228 can additionally include a plurality of power leads 240A, 240B, including a supply line power lead 240A and a neutral line power lead 240B. Alternately or additionally, the supply line power lead 240A and/or neutral line power lead 240B can be used to carry communications, reducing the number of interconnects that can be implemented in the first and second connectors 234, 236. Alternately or additionally, the supply line power lead 240A and/or the neutral lie power lead 240B can each comprise a unitary bus or a redundant bus.

2. Power Conversion Circuits

The PCB 228 can include power conversion circuits 230 mounted on the PCB 228. The power conversion device 218 can include 12 power conversion circuits 230, or more or less than 12 power conversion circuits 230 depending on the desired application.

In some embodiments of the invention, each of power conversion circuits 230 can comprise relatively inexpensive consumer electronics. As used herein, "consumer electronics" refers to electronic devices, circuits, and components manufactured in quantities of a million or more, where the mass production of the device, circuit or component has driven the cost of the device, circuit or component down to a level that is considered affordable by millions of consumers. For instance, consumer electronic devices include cell phones, mp3 players, and other handheld electronic devices as well as the capacitors, inductors, transistors and other components included in the handheld devices.

One characteristic of many consumer electronics is that they operate at power levels less than 100 watts. In some embodiments, at 100% output, each of the power conversion circuits 230 can be configured to output about 25 watts of power. Alternately or additionally, each of the power conversion circuits 230 can be configured to output up to 50 watts of power in certain circumstances, such as in the event that one or more of the power conversion circuits 230 has failed or is switched off. As such, the power conversion device 218 can include one or more power conversion circuits 230 that are redundant, allowing the power conversion device 218 to operate using less than all of the power conversion circuits 230 at time.

Another characteristic of many consumer electronics is that they can be switched at relatively higher frequencies due to their reduced power output and smaller size.

As mentioned above, the power conversion device 218 can be redundantly connected to the PV module 200. In particular, the power conversion device 218 can be redundantly connected to the PV module 200 by grounding each of the power conversion circuits 230 through the backsheet 212 and providing separate connections between each power conversion circuit 230 and the bottom spacer 210A. The separate connection between each power conversion circuit 230 and the bottom spacer 210A can include one or more of: traces, leads, and/or solder pads formed in the PCB 228, the stress-relief fold 222 of bottom spacer 210A, solder interconnecting the traces/leads/solder pads formed in the PCB 228 to the stress-relief fold 222, or the like or any combination thereof.

The redundant connection of the power conversion device 218 to the PV module 200 and the inclusion of one or more redundant power conversion circuits 230 can allow the power conversion device 218 to operate using less than all of the power conversion circuits at a time. For instance, with combined reference to FIGS. 2A and 2C, in operation, current can flow from the top row 206A of PV cells 204 to the bottom spacer 210A through the PV cells 204 and spacers 210. At the bottom spacer 210A, the current can be equally divided and received by the power conversion circuits 230, each of which is separately connected to the bottom spacer 210A.

Alternately or additionally, at least one power conversion circuit 230A can comprise a failed or switched off power conversion circuit 230A. In this case, the current that would have normally been received by power conversion circuit 230A can flow through the bottom spacer 210A in the negative x-direction to be received by power conversion circuit 230B, 230C, or other power conversion circuit 230 instead.

The power conversion circuits 230 can be configured to provide power conditioning of the electrical power generated by the PV cell array 204. As used herein, "power conditioning" can include voltage conversion, maintaining peak power of the power supply collectively generated by the PV cells 204, and/or reducing current ripple at the input and output of power conversion device 218.

The power conversion circuits 230 can provide voltage conversion of the power supply generated by the PV cell array 204 in order to generate a conditioned output power supply having a relatively higher voltage and lower current suitable for long-distance transmission. For instance, the PV cell array 204 may generate 200 watts of direct current ("DC") electrical power at 8 volts and 25 amps. In the absence of power conversion circuits 230, long-distance transmission of such a power supply can be cost-prohibitive as it may require a relatively large, and therefore expensive, conductor.

However, the 200-watt output of PV cell array 204 can be divided among, for instance, five of power conversion circuits 230, such that each of the five power conversion circuits 230 can receive 40 watts of DC electrical power at 8 volts and 5 amps. Further, each of the power conversion circuits 230 can be configured to convert the voltage and current of the DC power supply to a higher voltage and a lower current. For instance, each of the five power conversion circuits 230 in this example may be able to convert the voltage and current of the individual 40-watt power supplies to 54 volts and 0.74 amps. The 54-volt 0.74-amp output of each of the five power conversion circuits 230 can then be output onto the supply line power lead 240A where they combine into a 200-watt power supply at about 54 volts and 3.7 amps, allowing the 200-watt DC power supply to be transmitted long-distance via a relatively smaller and less expensive conductor than would otherwise be required for a 200-watt DC power supply at 8 volts and 25 amps.

In other embodiments of the invention, the power conversion circuits 230 can step up the voltage to as little as 12 volts or as much as 60 volts. Alternately or additionally, each of the power conversion circuits 230 can be configured to release less than 2 joules of energy after an interrupt is detected and the power conversion circuits 230 are switched off.

Each one of the power conversion circuits 230 can comprise a step-up DC-DC converter with an output DC voltage that is greater than its input DC voltage. Examples of step-up DC-DC converters include boost converters, buck-boost converters, SEPIC converters, and Ćuk converters. Alternately or additionally, the power conversion circuits 230 can comprise other step-up DC-DC converters that are now known or later developed.

Figure 2E:
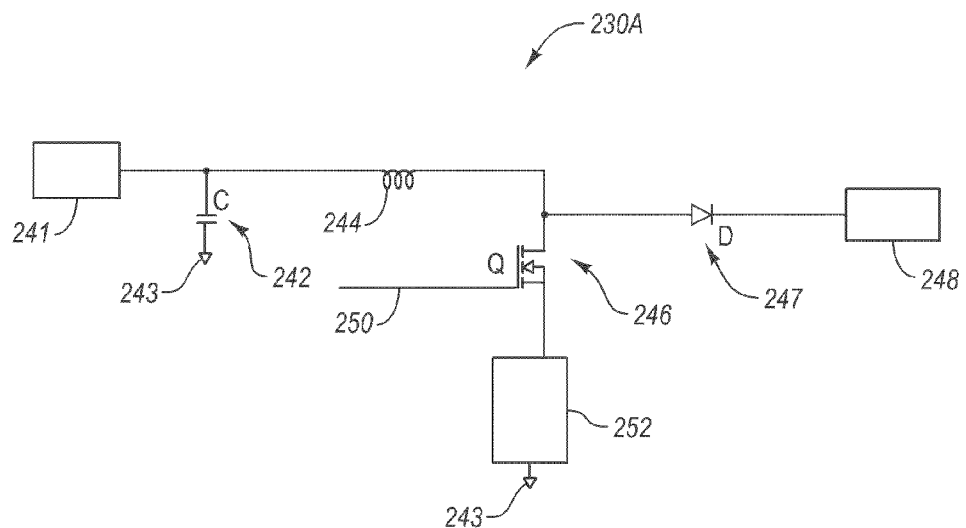

FIG. 2E discloses one example of a power conversion circuit 230A implemented as a boost converter. The power conversion circuit 230A may correspond to the power conversion circuits 230 of FIG. 2C. The power conversion circuit 230A can include one or more components not shown in FIG. 2E, such as components for fusing, safety, and/or other purposes, but such components are not shown in FIG. 2E for clarity. Further, power conversion circuit 230A is merely an example of one step-up DC-DC converter that can be employed according to embodiments of the invention and should not be construed to limit the invention in any way. Indeed, embodiments of the invention include step-up DC-DC converters that can be configured differently than the power conversion circuit 230A.

As shown in FIG. 2E, power conversion circuit 230A can include an input 241, a capacitor 242 coupled to the input 241 and to ground 243, an inductor 244 coupled to the input 241 and to capacitor 242, a switch 246 coupled to the inductor 244, a diode 247 coupled to the inductor 244 and to switch 246, an output 248 coupled to diode 247, a control line 250 coupled to the switch 246, and one or more measurement circuits 252 coupled between power conversion circuit 230A and ground 243.

With combined reference to FIGS. 2A and 2E, the input 241 can be coupled to the bottom row 206B of PV cells 204 via bottom spacer 210A. The output 248 can be coupled to a power supply bus (not shown) that may correspond to the supply line power lead 132A of FIG. 1C. The control line 250 can be coupled to a control module (not shown) that can be included in the power conversion circuit 230A and/or that can be shared between two or more of the power conversion circuits 230. In some embodiments, the control module can provide a pulse-width modulated ("PWM") control signal to the switch 246 that controls the switching frequency and/or duty cycle of power conversion circuit 230A. Alternately or additionally, the PWM control signal can control the phasing of power conversion circuit 230A relative to the phasing of other power conversion circuits 230. Alternately or additionally, the PWM control signal can be generated by a crystal oscillator (not shown) disposed within power conversion device 218 external to the power conversion circuit 230A. In some cases, the power conversion device 218 can include a plurality of crystal oscillators, one each for power conversion circuits 230.

The switch 246 can comprise a field-effect transistor ("FET"), a metal-oxide-semiconductor FET ("MOSFET"), an insulated-gate bipolar transistor ("IGBT"), a bipolar junction transistor ("BJT"), or other suitable switch. The diode 247 can comprise a Schottky rectifier, or other suitable diode.

The measurement circuit 252 can include one or more resistors and can be employed to measure certain operating parameters of the power conversion circuit 230A. For instance, the measurement circuit 252 can measure the maximum current buildup per switching cycle in inductor 244 in order to maintain maximum peak power. Alternately or additionally, the measurement circuit 252 can measure the charging rate of the inductor 244, the input voltage of power conversion circuit 230A, the output voltage of power conversion circuit 230A, or the like or any combination thereof.

In operation, the power conversion circuit 230A can receive a portion of the unconditioned power generated by PV cell array 204 at input 241 and can step up the voltage of the received portion of unconditioned power by switching itself on and off via switch 246. In the on-state, the switch 246 can be closed such that the current flowing through inductor 244 can increase and can return to ground 243 through the switch 246 and measurement circuit 252. In the off-state, the switch 246 can be open such that the current flowing through the inductor 244 can decrease, flowing through the diode 247 and output 248 to power supply bus 226.

In the on-state of power conversion circuit 230A, the voltage at output 248 can be about 0 volts. In the off-state, the voltage at output 248 can depend on the rate of change of current through inductor 244, rather than on the input voltage at input 241. In turn, the rate of change of current through inductor 244 can depend on the inductance of the inductor 244. Accordingly, the stepped-up voltage at output 248 can depend on the inductance of inductor 244. Alternately or additionally, the stepped-up voltage at output 248 can depend on the switching frequency of switch 246 and/or the duty cycle of switch 246.

By cycling the power conversion circuit 230A on and off in continuous mode, e.g. the current through the inductor never reaches 0 amps, the power conversion circuit 230A can produce conditioned power, e.g. power having a stepped-up voltage, at output 248.

In this and other embodiments, the switch 246 can be operated via control line 250. In particular, a control module can send signals, directly or indirectly via a gate driver, over control line 250 to open and close the switch 246 at a desired frequency and duty cycle. Because each of the stepped-up voltage and the impedance of the power conversion circuit 230A can depend on the frequency and duty cycle of the switching process, the control module that controls the switch 246 can set the frequency and/or duty cycle at a predetermined frequency and/or duty cycle to optimize the stepped-up voltage and the impedance of the power conversion circuit 230A.

In some cases, the opening and closing of switch 246 can generate electromagnetic interference ("EMI"). The frequency of the EMI can depend on the switching frequency of switch 246. The Federal Communications Commission ("FCC") and/or other bodies may define limits on allowable EMI peak energies at any specific EMI frequency. To avoid exceeding such limits, the power conversion circuit 230A, and more particularly, the switch 246, can be operated with a spread spectrum switching frequency, such that the energy generated by EMI is spread across a spectrum of frequencies rather than being concentrated at any specific frequency.

With continued reference to FIGS. 2A and 2E, in some embodiments, the constantly increasing and decreasing current through the inductor 244 can cause periodic variations in the amplitude of the input current and/or output current of power conversion circuit 230A. These periodic variations in the current amplitude are also known as current ripple. Current ripple at the input of power conversion circuit 230A can cause the impedance of the power conversion circuit 230A to vary as a function of the current ripple, making it difficult for the power conversion circuit 230A to maintain maximum peak power. Current ripple at the output of power conversion circuit 230A can result in a noisy power supply that may negatively affect a load coupled to the power supply.

However, current ripple can be substantially reduced at the input and output of power conversion device 218 as a whole by operating the power conversion circuits 230 out of phase with each other. When the power conversion circuits 230 are operating out of phase with each other, the amplitude of current ripple in one of power conversion circuits 230 can be increasing while the amplitude of current ripple in another of power conversion circuits 230 can be decreasing. The cumulative effect of the out-of-phase operation of power conversion circuits 230 can average out the current ripple at the input and output of the power conversion device 218 as a whole.

As mentioned above, measurement circuit 252 can measure one or more operating parameters of power conversion circuit 230A. The measurement circuit 252 can include one or more resistive circuits coupling one or more analog to digital converters ("ADCs") to different points on the power conversion circuit 230A so as to measure different operating parameters of power conversion circuit 230A. The measured operating parameters can include one or more of the input voltage of power conversion circuit 230A, the current flowing through inductor 244, the maximum current buildup per switching cycle in inductor 244, the charging rate of the inductor 244, the stepped-up output voltage of power conversion circuit 230A, or the like or any combination thereof.

The power conversion circuits 230, 230A can each generally be configured to output a stepped-up voltage between 12-60 volts from an input voltage of 3-12 volts. The stepped-up voltage can be regulated by one or more control modules included in the power conversion device 218 to a particular voltage that may match a load voltage of a load driven by the conditioned power output of the power conversion device 218.

For instance, 12-volt batteries commonly used in conjunction with PV modules can be located a relatively short distance from the PV modules, such that a 12-volt output for charging the batteries is suitable for the short-distance transmission. Alternately or additionally, the batteries can comprise 24- or 48-volt batteries and/or the distance to the batteries can be relatively farther away such that a 24- or 48-volt output can be more suitable. Alternately or additionally, a 60-volt output can be suitable for even longer transmission distances. Alternately or additionally, the power conversion circuits 230, 230A can output a stepped-up voltage at some other predetermined voltage.

Figure 3:
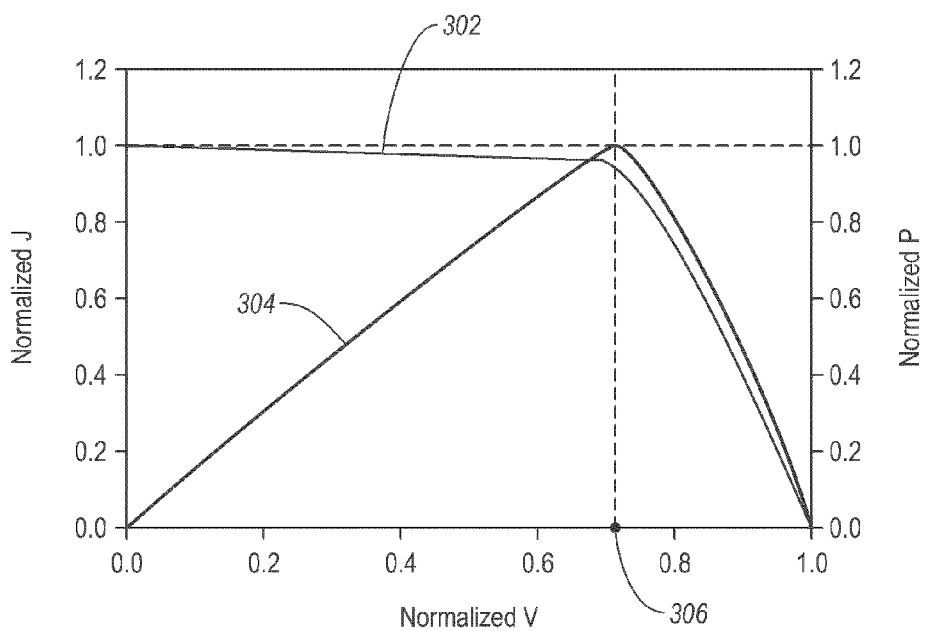
FIG. 3 discloses example IV and PV curves for a PV cell or PV module.

With combined reference to FIGS. 2A-2E, and as mentioned above, the maximum value of the current buildup and/or the charging rate of the inductor 244 can be used by the power conversion circuits 230, 230A in maintaining peak power of the PV cell array 204. Maintaining peak power can maximize the unconditioned power output of the PV cell array 204, and consequently of the conditioned power output from power conversion device 218. As will be explained below, maintaining peak power can generally include (1) identifying a peak power point at which power output of the PV cell array 204 is maximized and (2) setting the impedance of the power conversion circuits 230 to effectively match the impedance of a load such that the voltage across the PV cell array 204 is substantially equal to the identified peak power point As an aid in understanding peak power maintaining, FIG. 3 graphically discloses the current and power of an example PV cell or PV cell array as a function of voltage. The x-axis represents normalized voltage V (e.g., actual voltage divided by maximum voltage). The left y-axis represents normalized current J. The right y-axis represents normalized power P. FIG. 3 includes an IV curve 302 and a PV curve 304. IV Curve 302 and PV curve 304 include, respectively, data representative of the current and the power of the PV cell or PV cell array as a function of voltage.

With reference first to IV curve 302, the current is at a maximum of 1 when the voltage is 0, e.g. when the PV cell or PV cell array is shorted into itself. As the voltage is increased from 0 to about 0.7, the current gradually decreases to more than 0.9. As the voltage increases beyond about 0.7, the PV cell or PV cell array can become biased beyond its capabilities and the current begins to drop off rapidly until it reaches 0 at a voltage of 1.

With reference next to PV curve 304, power is the product of voltage and current. In this case, each of the data points of PV curve 304 may be equal to the product of the voltage and current of the IV curve 302 data points. As seen in FIG. 3, the power is at a minimum of 0 when either one of the voltage or current is equal to 0. Further, the power increases from 0 to a maximum of 1 as the voltage increases from 0 to about 0.7, and then falls off to 0 as the voltage increases from about 0.7 to 1.

The PV curve 304 can be referred to as a maximum peak power curve and can be used to derive a peak power point 306, i.e., a predetermined voltage, at which power produced by a PV cell or PV cell array can be maximized. In particular, in this example, the power generated by the PV cell or PV cell array can be maximized at a peak power point 306 of about 0.7.

The peak power point 306 for a PV cell or PV cell array can vary as a function of, among other things, illumination intensity. For example, the peak power point 306 of a PV cell or PV cell array exposed to direct sunlight can change when the PV cell or PV cell array is overshadowed by a cloud or other object.

Further, the PV cell or PV cell array can be used to drive a load or loads that can have an impedance that is not matched to the impedance of the PV cell or PV cell array. When the PV cell or PV cell array is not impedance matched to the load, the PV cell or PV cell array may have to operate at a voltage that is above or below the peak power point 306 to drive the load. As can be seen with respect to the PV curve 304 of FIG. 3, the power output of a PV cell or PV cell array is not maximized when the PV cell or PV cell array does not operate at the peak power point 306. Further, in some cases, the impedance of the load can vary when, for example, devices are switched in and out of the circuit driven by the PV cell or PV cell array.

Embodiments of the invention can accordingly include power conversion circuits 230 configured to maintain the maximum peak power of the PV cell array 204 to ensure the PV cell array 204 operates substantially at maximum peak power. As used herein, maintaining peak power for a PV cell array such as PV cell array 204 can include (1) identifying the peak power point of the PV cell array 204 at which power output from the PV cell array 204 is maximized and (2) setting the impedance of the power conversion circuit 230 to match the impedance of a load such that the voltage across the PV cell array 204 is substantially equal to the identified peak power point.

In some embodiments, the impedance of the power conversion circuits 230 can be set such that the voltage across the PV cell array 204 is within 10% of the available peak power point. Alternately or additionally, the impedance of the power conversion circuits 230 can be set such that the voltage across the PV cell array 204 is within 2% of the available peak power point averaged over time.

Power conversion device 218 can implement any method now known or later developed for maintaining maximum peak power for PV cell array 204. For example, power conversion device 218 can implement a circuit switching method, a perturb and observe method, an AC ripple control method, a fixed Voc offset method, or the like or any combination thereof. In some embodiments, the power conversion device 218 can implement a circuit switching method in combination with one or more other methods.

As explained above, each of the power conversion circuits 230 can comprise a boost converter such as depicted in the power conversion circuit 230A of FIG. 2E. In this example, each of the power conversion circuits 230A can include an inductor 244 and measurement circuit 252. The measurement circuit 252 can measure the maximum current per cycle of the inductor 244 to identify the peak power point. If the peak power point needs to be adjusted, the impedance of the power conversion circuit 230A can be adjusted and set to match the impedance of a load by changing the frequency and/or duty cycle of the switching process associated with the power conversion circuit 230A.

Returning to FIGS. 2A-2C, embodiments of the power conversion device 218 can include redundant power conversion circuits 230. In this and other embodiments, all or less than all of the power conversion circuits 230 can be operated at a time by the power conversion device 218. For instance, if the PV module 200 is only receiving 50% illumination, the power conversion device 218 can optionally operate all of the power conversion circuits 230 at less than 100% power each, or operate less than all of the power conversion circuits 230 at 100% power each.

3. Active Ground Fault Detection

Returning to FIG. 2C, one or more control modules can be disposed on the PCB 228 and/or integrated into each of power conversion circuits 230. In some embodiments of the invention, each of the one or more control modules can include an active ground fault detection device (not shown) coupled to the supply line power lead 240A and the neutral line power leads 240B. The active ground fault detection device can monitor outgoing current in the supply line power lead 240A and returning current in the neutral line power lead 240B. Any imbalance between the outgoing current and returning current, or an "interrupt," can be indicative of a cut or severed power line or other safety hazard in the downstream circuit.

In this and other embodiments, after the active ground fault detection device identifies the interrupt, the control module can switch off the corresponding power conversion circuit 230 to discontinue sending electrical power through the supply line power lead 240A. When the power conversion circuits 230 are switched off, if the PV cell array 204 is still generating current, the power conversion circuits 230 can be configured to shunt the current back into the PV cell array 204.

Because the active ground fault detection device can be incorporated into a control module included in each power conversion circuits 230, the power conversion circuits 230 can be switched off very quickly when an interrupt is detected. Indeed, in some embodiments, the power conversion circuits 230 can be shut down quickly enough that the power conversion device 218 discharges less than 24 Joules of energy after identifying the interrupt.

Alternately or additionally, the maximum output voltage of power conversion device 218 can be 60 volts. In some embodiments, the 24-Joule and 60-volt limits per power conversion device 218 can allow up to ten PV modules 200 and power conversion devices 218 to be serially connected in a PV system that can qualify as a low voltage device according to standards established by Underwriters Laboratories Inc. ("UL"). The UL low voltage device standard defines a low voltage device as a device that discharges a maximum of 240 Joules after detecting an interrupt and that has a maximum voltage of 60 volts. In this particular example, a PV system with ten serially-connected PV modules 200 and power conversion devices 218 can discharge a maximum of 240 Joules in aggregate after detecting an interrupt, e.g., ten power conversion devices 218 times 24 Joules per power conversion device 218=240 Joules, and can have a maximum voltage of 60 volts.

More generally, the maximum output voltage of each power conversion device 218 in a PV system can be 60 volts and the maximum energy discharge of each power conversion device 218 after detecting an interrupt can be less than X/240 Joules of energy, where X is the number of serially connected PV modules 200 in the PV system. Accordingly, if the PV system includes only 5 serially connected PV modules 200, the power conversion circuits 230 for each of five power conversion devices 218 can be shut down quickly enough such that each of the five power conversion devices 218 discharges less than 48 Joules of energy after detecting the interrupt.

Notably, the UL electrical safety standards for low voltage devices allow compliant systems to implement a non-insulated ground and relatively thin insulators. In particular, the backsheet 212 of PV module 200 is the ground of the PV cell array 204 and does not need to be insulated to comply with the UL electrical safety standards for low voltage devices when the PV module 200 complies with 240-Joule maximum interrupt discharge energy and 60-volt maximum operating voltage standards just mentioned. For the same reason, the PV module 200 can comply with the UL electrical safety standards while employing "thin" insulators between the backsheet 212 and PV cells 204, e.g. buffer layer 216, that can be 3-10 mils thick. In some embodiments, the use of a non-insulated ground and thin insulators can decrease manufacturing costs of the PV module 200.

The use of a thin buffer layer 216 between the backsheet 212 and PV cells 204 that is 3-10 mils thick can alternately or additionally improve the thermal conductivity between the backsheet 212 and PV cells 204. In particular, the PV cells 204 can be closer to the backsheet 212 than in a conventional PV module which can include a thick buffer layer that is 10-20 mils thick. The closeness of the PV cells 204 to the backsheet 212 can result in improved thermal conductivity between the PV cells 204 and the backsheet 212 compared to a conventional PV module. The improved thermal conductivity, in turn, can improve heat dissipation away from the PV cells 204 during operation.

4. Power Conversion Device Housing

FIGS. 2B and 2C disclose aspects of the first housing 232 included in power conversion device 218. In some embodiments, the first housing 232 can have a width $w_h$ of approximately 915 mm, or the width $w_h$ can be more or less than 915 mm. The PV module 200 can further include a second housing 254 and heatsink 256 that cooperate with the first housing 232 to protect the PCB 228, power conversion circuits 230 and/or other components of the power conversion device 218 from exposure to moisture and/or other environmental factors.

The first and second housings 232, 254 can be integrated into a single housing in some embodiments. Alternately or additionally, the second housing 254 and heatsink 256 can be integrated into a single component. Alternately or additionally, one or more of the first housing 232, second housing 254, and heatsink 256 can comprise plastic, aluminum, sheet metal, or other suitable material(s) that has been rolled, extruded, or otherwise formed.

In some embodiments of the invention, a plurality of fasteners 258, such as screws, bolts, or the like, can be employed to secure the power conversion device 218 to the second housing 254 and/or heatsink 256. For example, in this and other embodiments, the PCB 228 and second housing 254 can include a plurality of through holes and the heatsink 256 can include a plurality of tapped holes for receiving fasteners 258. After aligning the through holes of the PCB 228 and second housing 254 with the tapped holes of the heatsink 256, the fasteners 258 can be inserted through the PCB 228 and second housing 256 to threadably secure the power conversion device 218 to the heatsink 256. Alternately or additionally, the fasteners 258 can ground the PCB 228 and other electrical components of power conversion device 218 to the backsheet 212 via second housing 254 and heatsink 256.

5. Power Conversion Device Connectors

As already mentioned above, the power conversion device 218 can include first and second connectors 234, 236 (FIG. 2C) that are complementary to each other. Each of the first and second connectors 234, 236 can include a connection to the supply line power lead 240A and the neutral line power lead 240B.

In some embodiments, the first and second connectors 234, 236 can be coupled to a load or battery storage via, respectively, a complementary second and first connector included in the circuit of the load or battery storage. Alternately or additionally, the first and second connectors 234, 236 can be employed to couple together two or more PV modules 200 in a side-by-side arrangement. For instance, the first connector 234 of a first PV module 200 can be coupled into the second connector 236 of a second PV module 200 that is adjacent to the first PV module 200.

Figure 4A:
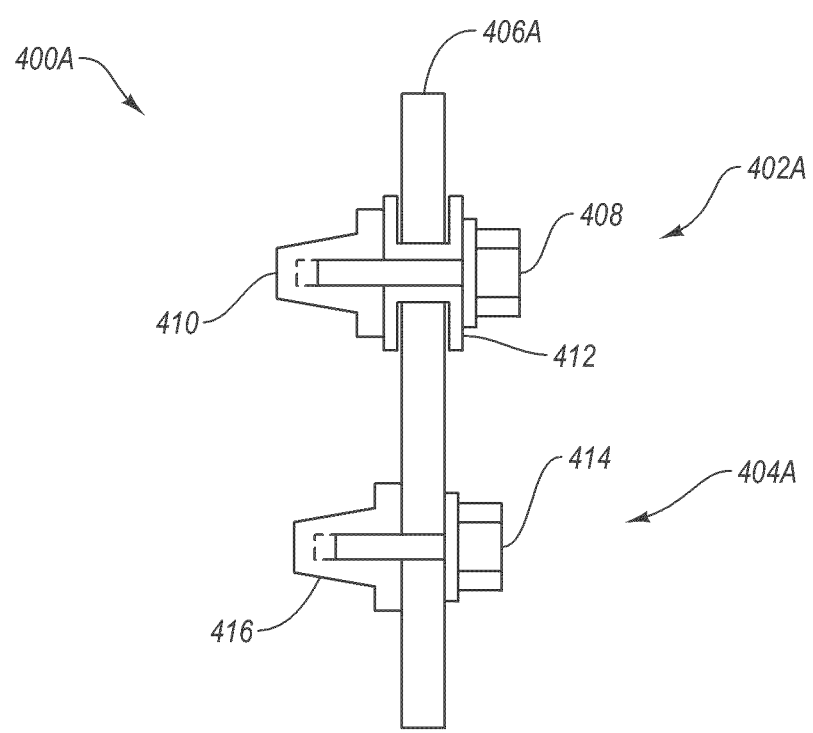
FIGS. 4A-4B disclose examples of externally accessible positive and ground terminals that can be included in a power conversion device.
Figure 4B:
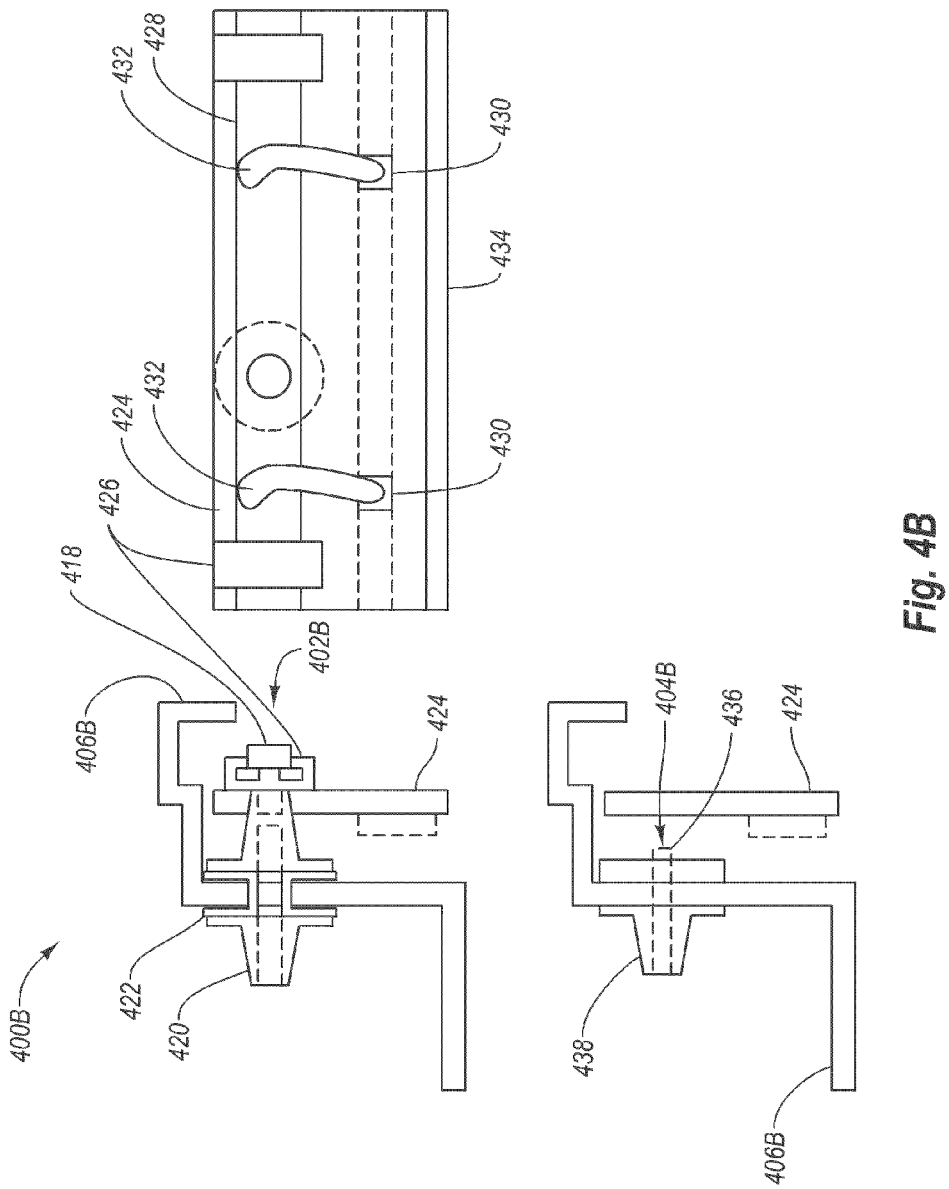

In addition to or instead of implementing first and second connectors 234, 236 that include connections to the supply line power lead 240A and the neutral line power lead 240B, the power conversion device 218 can implement a positive terminal and a ground terminal, such as disclosed in FIGS. 4A and 4B. In particular, each of FIGS. 4A and 4B depicts a possible configuration 400A or 400B for a positive terminal 402A or 402B and a ground terminal 404A or 404B of a power conversion device.

In each of FIGS. 4A and 4B, a housing component 406A and 406B can be provided that corresponds to one or more of the second housing 254 or heatsink 256 of FIG. 2B. Further, as will be described below, the housing component 406A, 406B, second housing 254 or heatsink 256 can be coupled to the electrical ground of PV module 200, which electrical ground can be the backsheet 212 in some embodiments.

Although not shown, each of the positive terminals 402A or 402B can be coupled to the supply line power lead 240A of PCB 228 (FIG. 2C) while the ground terminals 404A or 404B can be coupled to the neutral line power lead 240B. As such, the positive terminals 402A, 402B and negative terminals 404A, 404B can be employed to coupled adjacent PV modules 200 together and/or to couple the power output of a PV module to a load or battery storage.

In the configuration 400A of FIG. 4A, the positive terminal 402A can include a cap screw 408 or other fastener coupled to a positive terminal post 410 through housing component 406A via an insulating grommet 412. The ground terminal 404A can include a cap screw 414 or other fastener coupled to a ground terminal post 416 through housing component 406A. Each of the positive and ground terminal posts 410, 416 can provide a location to which a conductive wire or cable can be attached when coupling the positive terminal 402A and negative terminal 404A of a PV module 200 to an adjacent PV module 200 and/or to a load or battery storage.

In the configuration 400B of FIG. 4B, the positive terminal 402B can include a cap screw 418 or other fastener coupled to a positive terminal post 420 through housing component 406B via an insulating grommet 422. As shown, the cap screw 418 can also pass through a PCB 424 that may correspond to the PCB 228 of FIGS. 2B and 2C. One or more rubber or plastic connectors 426 can snap into a through hole in the PCB 424 to secure the cap screw 418 to the PCB 424 and to a power bus 428.

In some embodiments, the PCB 424 can include one or more solder pads 430 to receive solder strips 432 for interconnecting the power bus 428 to a supply line power lead (not shown) embedded in the PCB 424. Alternately or additionally, the PCB 424 can include a solder strip 434 for interconnecting the PCB 424 to a bottom spacer of a PV module, such as the bottom spacer 210A of PV Module 200 in FIGS. 2A-2C.

The negative terminal 404B in the configuration 400B of FIG. 4B can include a fastener 436 coupled to a ground terminal post 438 through housing component 406B. As in the configuration 400A of FIG. 4B, the positive and ground terminal posts 420, 438 in the configuration 400B of FIG. 4B can provide a location to which a conductive wire or cable can be attached when coupling the positive terminal 402B and negative terminal 404B of a PV module 200 to an adjacent PV module 200 and/or to a load or batter storage.

In FIGS. 4A and 4B, the conductive wires or cables connected to terminal posts 410, 416, 420, 438 can be relatively large, having cross-sectional areas at least 3 mm$^2$ or greater, but not greater than 150 mm$^2$ in some embodiments. As already mentioned, the conductive wires or cables can transmit the output power of a power conversion device to battery storage, a load, or other point of use.

D. Connections

Returning to FIGS. 2B and 2C, the PV module 200 can include a mechanical connection, an electrical ground connection and/or a thermal connection between the backsheet 212 and the power conversion device 218. The mechanical connection, electrical ground connection and/or thermal connection can comprise one or more of: structural tape, electrically conducting tape, thermally conductive silicon sealant, mechanical contact between the power conversion device 218 and backsheet 212 via one or more other components, mechanical fasteners and connectors, or the like or any combination thereof.

In more detail, in some embodiments, structural tape and/or electrically conducting tape can be applied at the interfaces between the stress-relief fold 226 of backsheet 212, the second housing 254, and the heatsink 256. Alternately or additionally, structural and/or electrically conducting tape can be applied at the interface between the heatsink 256 and backsheet 212.

In some embodiments, silicon sealant can be applied at one or more of the interfaces 260A-260D between the backsheet 212, heatsink 256, second housing 254, first housing 232, and front plate 202.

In some embodiments, mechanical contact between the power conversion device 218 and backsheet 212 can occur in a chain via fasteners 258, second housing 254, stress-relief fold 226, and heatsink 256. Alternately or additionally, mechanical contact between the power conversion device 218 and backsheet 212 can occur via fewer or more intermediary components.

In some embodiments of the invention, the backsheet 212, heatsink 256 and electrical ground for power conversion device 218 can be at a common potential.

E. Passive Row-Balancing

Embodiments of the invention can include PV modules that passively row-balance current across PV cells in each row and/or across rows in the PV module. As used herein, "passive row-balancing of current" refers to passively channeling current around one or more blocked PV cells or rows. As used herein, a PV cell is "blocked" if the current generated by the PV cell is substantially lower than the current generated by other PV cells in the same row. Similarly, a row is "blocked" if the current generated by the row is substantially lower than the current generated by other rows in the PV module.

The PV module 200 of FIGS. 2A-2C is one example of a PV module 200 that can implement passive row-balancing of current across the PV cells 204 in each row 206. Passive row-balancing of current across the PV cells 204 in each row 206 can be implemented by coupling the PV cells 204 within each row 206 to each other in parallel via spacers 210. Accordingly, if a PV cell 204 in top row 206A is blocked, the current that would otherwise flow through the blocked PV cell 204 can flow around the blocked PV cell 204 via top spacer 210B and then through one or more of the other PV cells 204 of top row 206A.

Figure 6A:
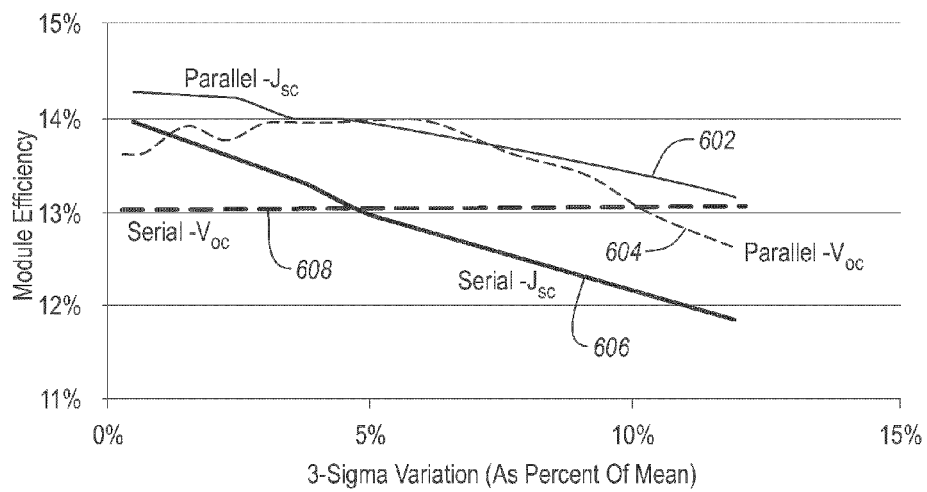
FIGS. 6A and 6B are graphical representations of the performance of various PV modules under non-uniform illumination.
Figure 6B:
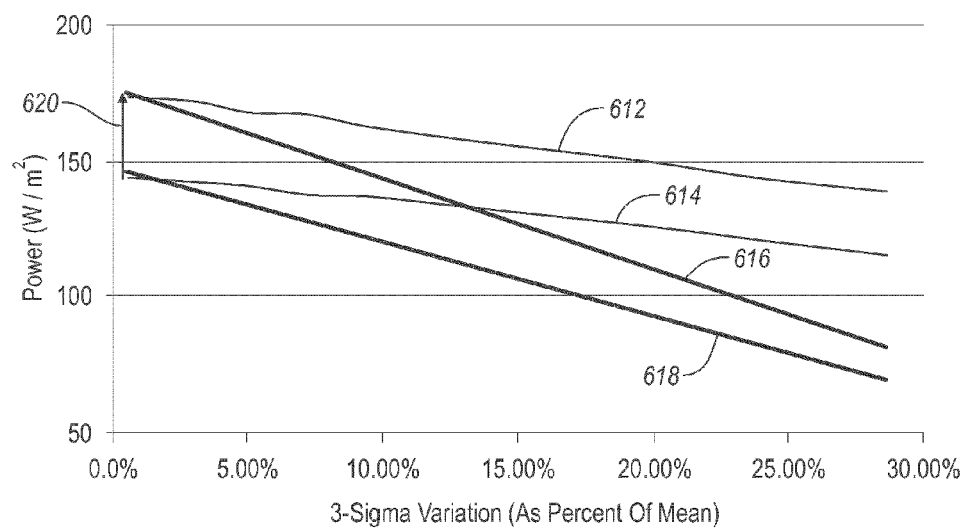

FIGS. 6A and 6B graphically compare the efficiency of a PV module having rows of parallel-connected PV cells that implement passive row-balancing ("parallel-connected PV module") of current across the PV cells in each row, such as the PV module 200 of FIGS. 2A-2C, to the efficiency of a conventional PV module having serial-connected PV cells ("serial-connected PV module"), each under non-uniform illumination conditions. The x-axis can represent 3-Sigma variations of the illumination intensity as a percent of the mean illumination intensity, which is one measure that can quantify the non-uniformity of illumination. The y-axis can represent the efficiency of the PV module.

Curves 602 and 604 can represent, respectively, the short circuit current Jsc and the open circuit voltage Voc of the parallel-connected PV module. By way of comparison, curves 606 and 608 can represent, respectively, the short circuit current Jsc and the open circuit voltage Voc of the serial-connected PV module.

In the serial-connected PV module, because the PV cells are all connected in series, the current in each PV cell has to be the same as in every other PV cell. Accordingly, when one of the PV cells is blocked, the blocked PV cell can limit the current in each of the other PV cells of the serial-connected PV module. Thus, the serially-connected PV module can be relatively sensitive to blocked PV cells and can generally perform to the level of the worst-performing PV cell, as illustrated by the relatively large negative slope of curve 606.

In contrast, because the PV cells in each row of the parallel-connected PV module are connected in parallel, the current in each PV cell of a row does not have to be the same as in every other PV cell of the same row. Accordingly, when one PV cell in a row is blocked, current can flow around the blocked PV cell through the other PV cells in the same row. Thus, the parallel-connected PV module can be relatively less sensitive to blocked PV cells, allowing greater variation in the current of the PV cells without performing to the level of the worst-performing PV cell, as illustrated by the less negative slope of curve 602 compared to the slope of curve 606.

With respect to the open circuit voltage Voc of a serial-connected PV module represented by curve 608, the curve 608 is flat, indicating that serial-connected PV modules are insensitive to variations in illumination intensity with respect to voltage.

The parallel-connected PV module can have some sensitivity to variations in illumination intensity with respect to voltage, as illustrated by the negative slope of the curve 604 after about a 5% 3-Sigma variation. However, voltage control can be more easily controlled in PV cells and PV modules than current control and voltage does not vary significantly with illumination such that the sensitivity of the parallel-connected PV module to variations in illumination intensity with respect to voltage is not a problem. Further, the parallel-connected PV module can perform better than the serial-connected PV module in terms of open circuit voltage up until a 3-Sigma variation in illumination intensity of about 10%.

FIG. 6B graphically compares the power output of a parallel-connected PV module to that of a serial-connected PV module at average illuminations of 1.0 Sun and 1.2 Suns. The x-axis can represent 3-Sigma variations of the illumination intensity as a percent of the mean illumination intensity and the y-axis can represent the power per surface area of the corresponding PV module.

Curves 612 and 614 can represent the power output per surface area of the parallel-connected PV module at average illuminations of, respectively, 1.2 Suns and 1.0 Sun. Curves 616 and 618 can represent the power output per surface area of the serial-connected PV module, also at average illuminations of, respectively, 1.2 Suns and 1.0 Sun.

As can be seen in FIG. 6B, at a 3-Sigma variation in illumination intensity of about 0%, corresponding to uniform illumination conditions, the power output per surface area of the serial-connected PV module (curves 616 and 618) can increase by about 20% when the average illumination intensity increases by 20%, e.g. from 1.0 Suns to 1.2 Suns. Similarly, the power output per surface area of the parallel-connected PV module (curves 612 and 614) can increase by about 20% when the average illumination intensity increases by 20%. The 20% gain in power output per surface area of each of the parallel-connected and serial-connected PV modules is represented in FIG. 6B by arrow 620.

FIG. 6B further depicts how, as the 3-Sigma variation in illumination intensity increases beyond 0%, the power output per surface area of the serial-connected PV module (curves 616 and 618) can drop off more quickly than the power output per surface area of the parallel-connected PV module (curves 612 and 614).

In addition, increasing non-uniformity in illumination conditions can cause the power output per surface area of the serially-connected PV module to drop more quickly at an average illumination of 1.2 Suns than at an average illumination intensity of 1.0 Suns. Thus, the curves 616 and 618 are converging as the 3-Sigma variation in illumination intensity increases.

However, the power output per surface area of the parallel-connected PV module can drop at about the same rate whether the average illumination is 1.2 Suns or 1.0 Suns. Thus, the parallel-connected PV module can come closer to a 20% gain in power output per surface area when the average illumination intensity is increased by 20% with increasing 3-Sigma variation in illumination intensity than a serial-connected PV module.

III. Second Example Photovoltaic Module

As explained above, PV modules according to embodiments of the invention can implement passive row-balancing of current across the PV cells in each row. Alternately or additionally, PV modules according to embodiments of the invention can implement passive row-balancing of current across the rows within the PV module. For example, FIGS. 5A and 5B disclose an example PV module 500 that can implement passive row-balancing of current across the rows within the PV module 500.

Figure 5A:
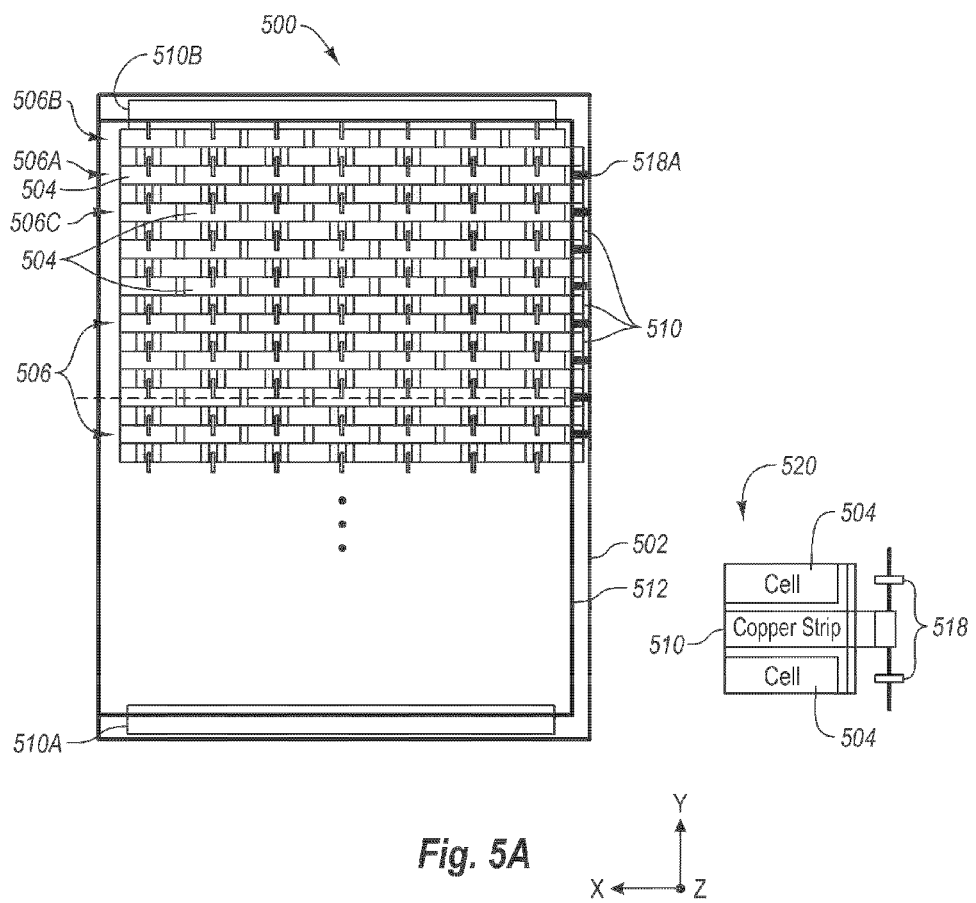
FIGS. 5A-5B disclose aspects of an example PV module that can include a redundantly connected power conversion device and a plurality of bypass diodes.

The PV module 500 may correspond to the PV modules 116, 124, 140 of FIGS. 1A-1D. FIG. 5A depicts a simplified back view of the PV module 500 and FIG. 5B depicts a diode representation of the PV module 500.

Figure 5B:
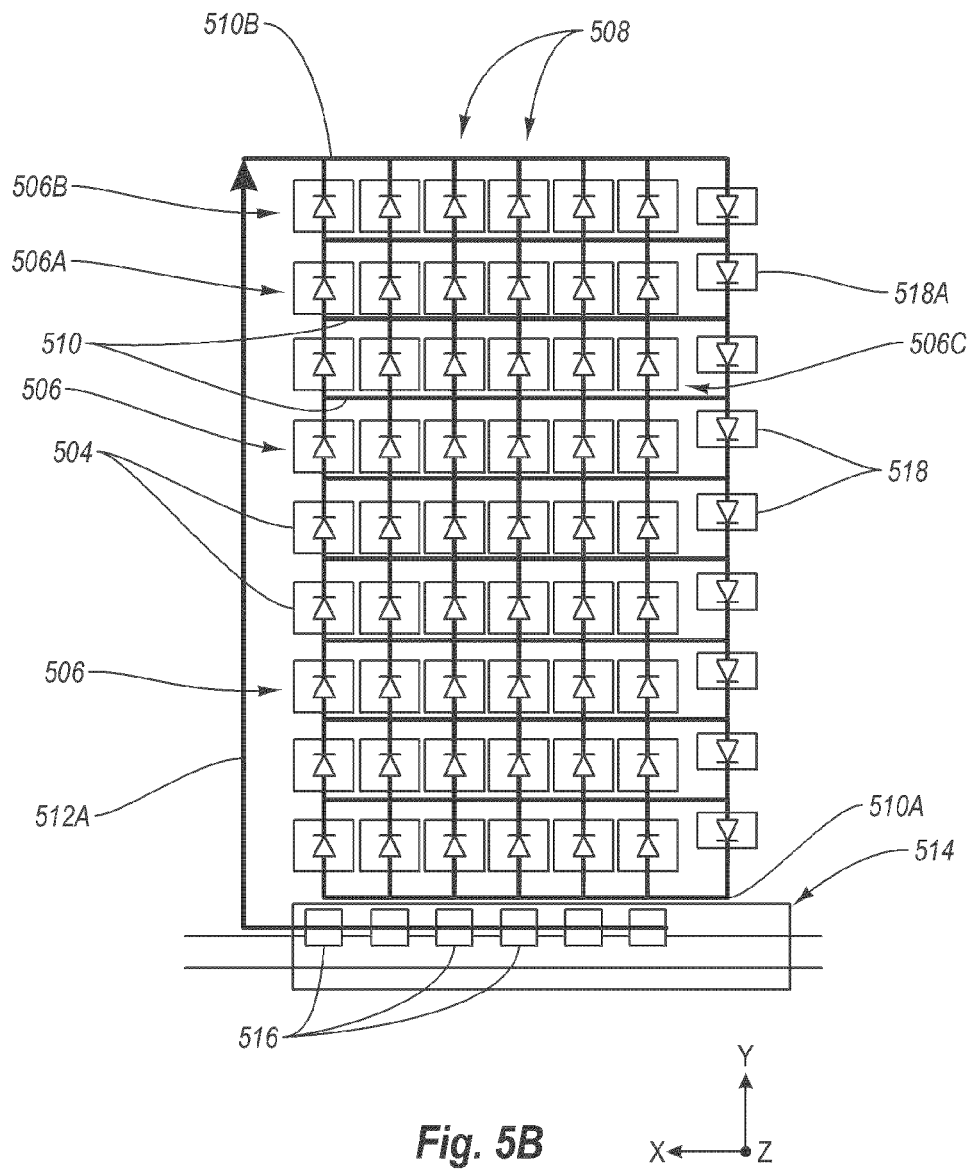

The PV module 500 of FIGS. 5A and 5B can be similar in some respects to the PV module 200 of FIGS. 2A-2C. For instance, the PV module 500 can comprise a front plate 502 (FIG. 5A), a plurality of PV cells 504 (collectively "PV cell array 504") disposed beneath the front plate 502 that can be arranged in rows 506 and columns 508, a plurality of spacers 510—including a bottom spacer 510A and top spacer 510B—interposed among the rows 506 of PV cells 504, a backsheet 512 displayed transparently in FIG. 5A to allow the PV cells 504 to be seen, and a power conversion device 514 (FIG. 5B) redundantly connected to the PV cell array 504 via power conversion circuits 516. Whereas the backsheet 512 can provide a return current path for the PV cell array 504, the backsheet 512 is identified in FIG. 5B as return current path 512A and is coupled between the power conversion device 514 and the top spacer 510B.

Although not shown in FIG. 5A or 5B, the PV module 500 can further include an adhesive layer, buffer layer and/or other components included in the PV module 200.

As shown, the PV module 500 can implement passive row-balancing of current across the PV cells 504 of each row 506 by coupling the PV cells 504 of each row in parallel with each other. In addition, the PV module 500 can implement passive row-balancing of current across the rows 506 by incorporating a plurality of bypass diodes 518. FIG. 5A includes an inset 520 depicting the connection of the bypass diodes 518 to the PV module 500. As shown in the inset 520, the bypass diodes 518 can be coupled to each other in series via the spacers 510. Further, as shown in the diode representation of FIG. 5B, each of bypass diodes 518 can be coupled in anti-parallel with the PV cells 504 of an adjacent row 506. For instance, bypass diode 518A is shown coupled in anti-parallel in FIG. 5B with the PV cells 504 of adjacent row 506A.

In some embodiments, the bypass diodes 518 allow current to flow around rows 506 that are blocked, such as the row 506A. For instance, row 506A can be blocked due to non-uniform illumination conditions, including actual and virtual non-uniform illumination conditions.

When a row 506A is blocked, the current produced by the row 506A is lower than the current produced by the other rows 506 such that the row 506A becomes a current bottleneck, limiting the current of every other row 506 to the current of row 506A. As a result, the row 506A, in the absence of bypass diodes 518, can effectively contribute a voltage loss—and consequently a power loss—to the power output generated by the PV cell array 504 that reaches the bottom spacer 510A and the power conversion device 514.

In operation, however, because each bypass diode 518 is connected in antiparallel with a corresponding row 506, when the voltage imbalance across a blocked row 506 becomes sufficiently large, the corresponding bypass diode 518 can open up and allow current to flow around the blocked row 506. Thus, in the example of FIGS. 5A and 5B, when the voltage imbalance across blocked row 506A becomes sufficiently large, a bypass diode 518A coupled in anti-parallel to blocked row 506A can open up to allow current to flow from row 506B through bypass diode 518A and around blocked row 506A to row 506C.

IV. Third Example Photovoltaic Module

Embodiments of the invention can alternately or additionally include PV modules that actively row-balance current across rows in the PV module. As used herein, "active row-balancing of current" refers to inputting module power or channeling current around one or more blocked rows using one or more active electronic devices.

Figure 7:
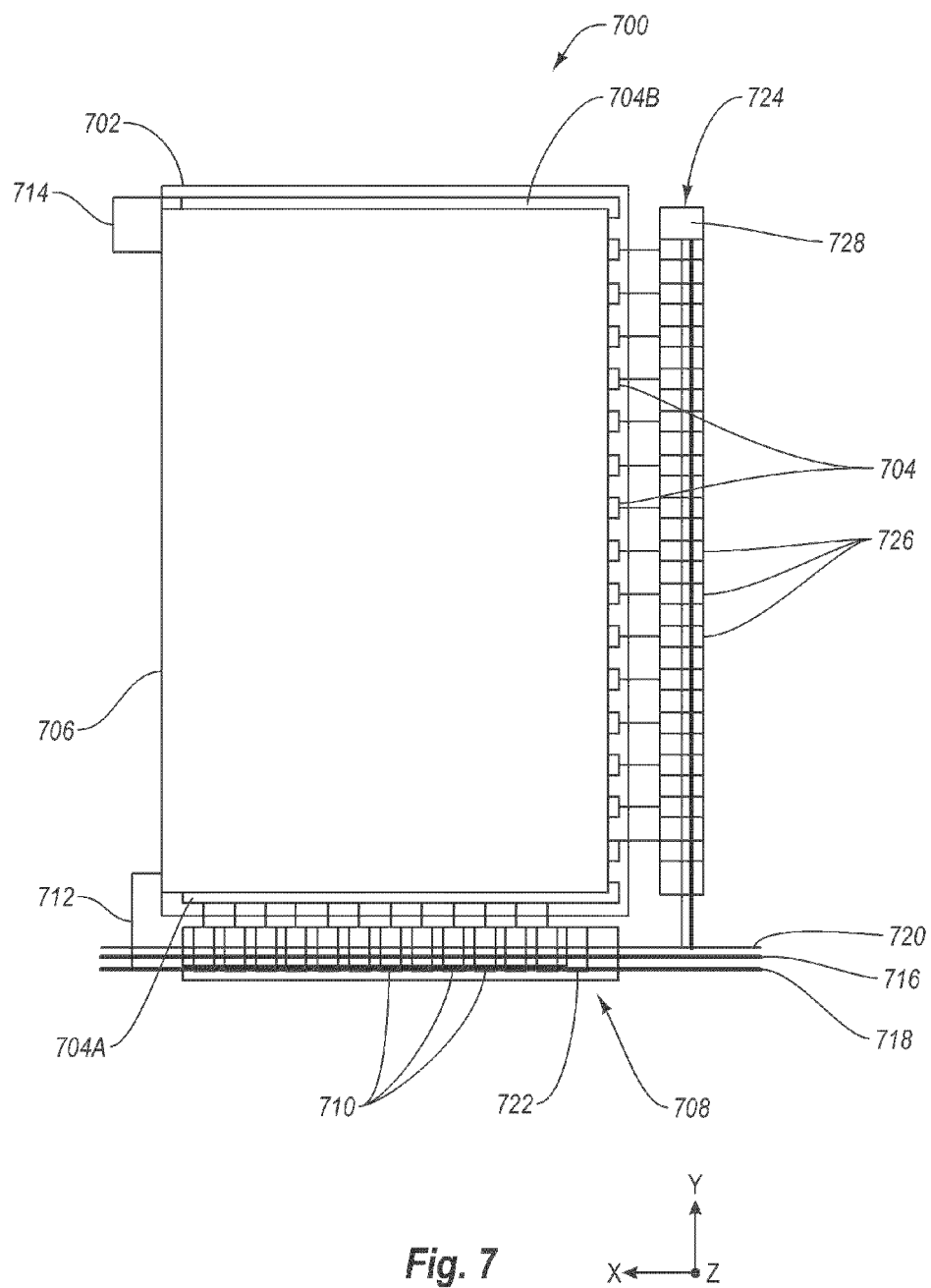
FIG. 7 discloses aspects of an example PV module that can include a redundantly connected power conversion device and an active row-balancing device.

For instance, FIG. 7 discloses an example PV module 700 that can implement active row-balancing across the rows within the PV module 700. The PV module 700 may correspond to the PV modules 116, 124, 140 of FIGS. 1A-1D. FIG. 7 depicts a simplified back view of the PV module 700.

The PV module 700 can be similar in some respects to the PV modules 200 and 500 of FIGS. 2A-2C and 5A-5B. For instance, the PV module 700 can comprise a front plate 702, a plurality of PV cells (not visible) disposed beneath the front plate 702 that can be arranged in rows and columns, a plurality of spacers 704—including a bottom spacer 704A and top spacer 704B—interposed among the rows of PV cells, a backsheet 706, and a power conversion device 708 redundantly connected to the PV cells of PV module 700 via bottom spacer 704A.

Although not shown in FIG. 7, the PV module 700 can further include an adhesive layer, buffer layer and/or other components included in the PV module 200 of FIGS. 2A-2C.

The power conversion device 708 can include a plurality of power conversion circuits 710 individually connected to the PV cells of PV module 700 via bottom spacer 704A. The power conversion circuits 710 and PV cells of PV module 700 can be commonly grounded to the backsheet 706. For instance, power conversion circuits 710 can be grounded to the backsheet 706 via a ground connection 712 than can include solder, or the like, interconnecting the power conversion circuits 710 to the backsheet 706. Similarly, the PV cells of PV module 700 can be grounded to the backsheet 706 via a ground connection 714 that can include solder, or the like, interconnecting the backsheet 706 to the PV cells of PV module 700 via top spacer 704B.

Additionally, the power conversion circuits 710 can be individually connected to a supply line 716, a neutral line 718, and a digital control line 720. The digital control line 720 can couple a control module 722 to each of power conversion circuits 710. The control module 722 can switch the power conversion circuits 710 on and/or off. Alternately or additionally, the control module 722 can control the duty cycle, operating frequency, or other aspects of each of the power conversion circuits 710. Alternately or additionally, each of power conversion circuits 710 can include its own control module, with the control module 722 comprising a master control module.

In addition, the PV module 700 can include an active row-balancing device 724 providing active row-balancing of current through the rows of PV cells of PV module 700. The active row-balancing device 724 can include a plurality of active electronic devices 726 interconnected between the rows of PV cells of PV module 700. Each active electronic device 726 can comprise a field effect transistor ("FET"), a gate driver, an inductor, a capacitor, a bypass diode, a microcontroller, or the like or any combination thereof. Alternately or additionally, the active electronic devices 726 can comprise consumer electronics.

In some embodiments, the active electronic devices 726 can be coupled to adjacent spacers 704 between adjacent rows of PV cells such that there is a 1:1 correspondence between active electronic devices 726 and rows of PV cells, allowing each active electronic device 726 to actively row-balance a single corresponding row of PV cells. Alternately, the active electronic devices 726 can be coupled to spacers 704 in an alternating fashion that skips every other spacer 704, every two spacers 704, or the like, such that there is a 1:2 or 1:X (X>2) correspondence between active electronic devices 726 and rows of PV cells, allowing each active electronic device 726 to actively row-balance two or more rows of PV cells.

Each of the active electronic devices 726 can be coupled to the supply line 716 such that the active row-balancing device 724 can be powered by the conditioned power output from power conversion device 708. Alternately or additionally, each of the active electronic devices 726 can be coupled to the digital control line 720 to allow the control module 722 of power conversion device 708 to control operation of the active electronic devices 726.

The active row-balancing device 724 can further include one, two, or more PBCs 728 upon which the active electronic devices 726, and/or leads, traces, or other components can be disposed. Each PCB 728 can be approximately one inch wide by 36 inches long. Alternately, the dimensions of PCB 728 can be different than the dimensions explicitly stated. In some embodiments, the length-to-width aspect ratio of the PCB 728 can be between 20:1 and 40:1, allowing the active electronic devices 726 to be coupled to corresponding spacers 704 along a side edge of PV module 700 using solder and/or other short-distance interconnections, without the use of flying leads. Alternately or additionally, using a PCB 728 having a length-to-width aspect ratio between 20:1-40:1 can allow the active row-balancing device 724 to be mounted along the side edge of the PV module 700 in a compact form.

In operation, the active electronic devices 726 can generally feed current into blocked rows of PV cells via spacers 704 in order to balance current in the PV module 700 and maximize the power output of the PV module 700 under varying non-uniform illumination conditions. In some embodiments, the active row-balancing device 724 can include sensors or other devices to detect if a row is blocked. When a blocked row is detected, the active row-balancing device can instruct a corresponding active electronic device 726 to feed current into the blocked row.

Alternately or additionally, active row-balancing device 724 and/or power conversion device 708 can undertake a loop process of feeding current into each of the rows of PV module 700 separately and measuring and recording the power output of the PV module 700 when each row is being fed additional current from a corresponding active electronic device 726. Once the power output measurements are recorded, a blocked or underperforming row can be identified that, when fed current, resulted in a maximum power output for the PV module 700. The active electronic device 726 corresponding to the blocked or underperforming row can then continue to feed current into the blocked or underperforming row. Alternately or additionally, a plurality of active electronic devices 726 corresponding to a plurality of blocked or underperforming rows can continue to feed current into the plurality of blocked or underperforming rows.

In this example, the control module 722 can individually instruct the active electronic devices 726 to feed current into the corresponding rows at separate times via the digital control line 720. Alternately or additionally, the control module 722 can measure the power output of the PV module 700 at the separate times to identify the blocked or underperforming row(s). Alternately or additionally, after the blocked or underperforming row(s) has been identified, the control module 722 can instruct the corresponding active electronic device(s) 726 to continue to feed current into the blocked or underperforming row(s).

As mentioned above, the active row-balancing device 724 can be powered by the conditioned power output of the PV module 700. The powering of the active row-balancing device 724 using the conditioned power output of PV module 700 can reduce the conditioned power output of the PV module 700. However, the gain in conditioned power output of the PV module 700 when the rows of PV cells are actively balanced can be greater than the loss of conditioned power output required to power the active row-balancing device 724. Thus, active row-balancing using an active row-balancing device 724 that is powered by the PV module 700 can result in a net gain in conditioned power output of the PV module 700 compared to operating the PV module 700 with unbalanced rows.

V. Fourth Example Photovoltaic Module

Figure 8:
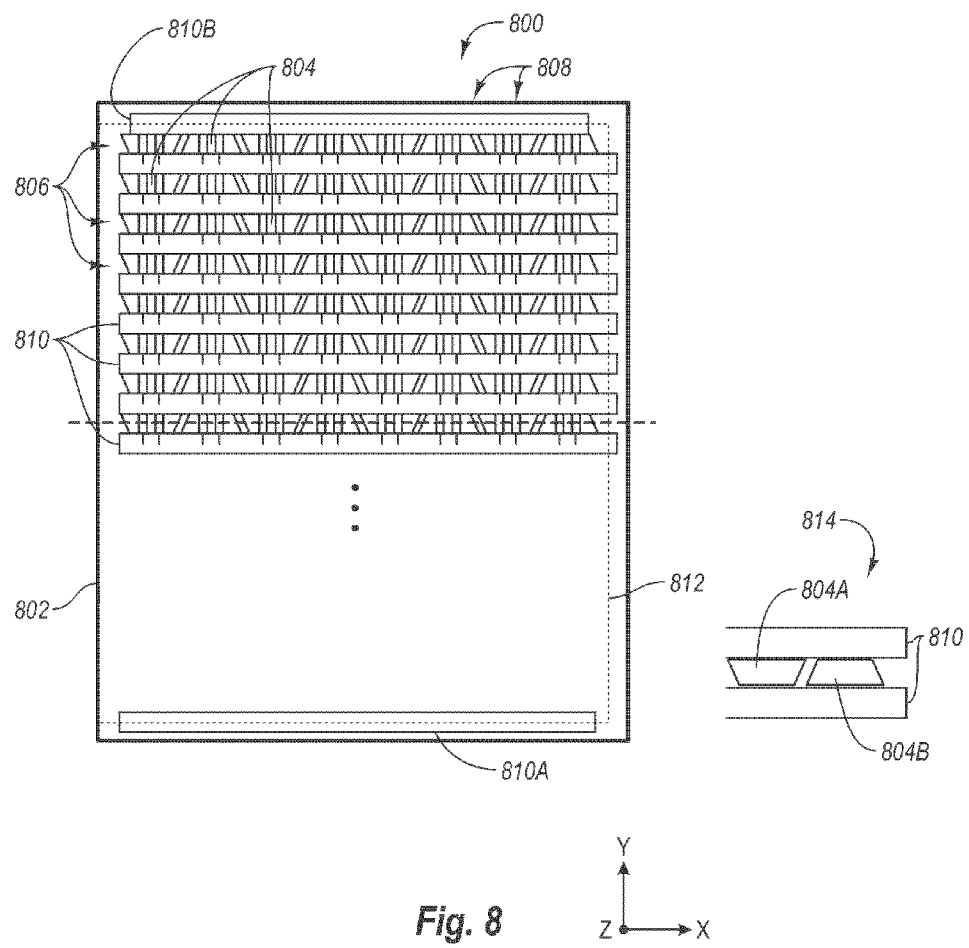
FIG. 8 discloses aspects of an example PV module that can include a redundantly connected power conversion device and trapezoidally shaped PV cells.
Figure 11A:
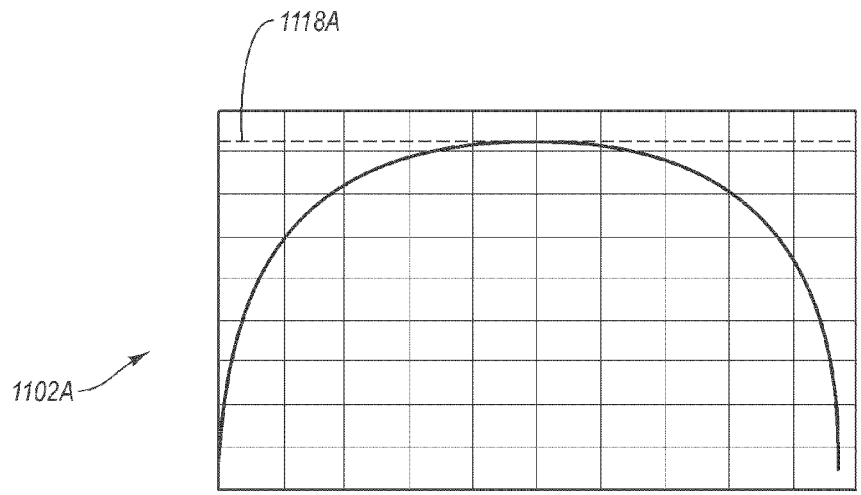
FIGS. 11A-11D disclose a variety of PV system configurations and corresponding thermal profiles during operation.
Figure 11A:
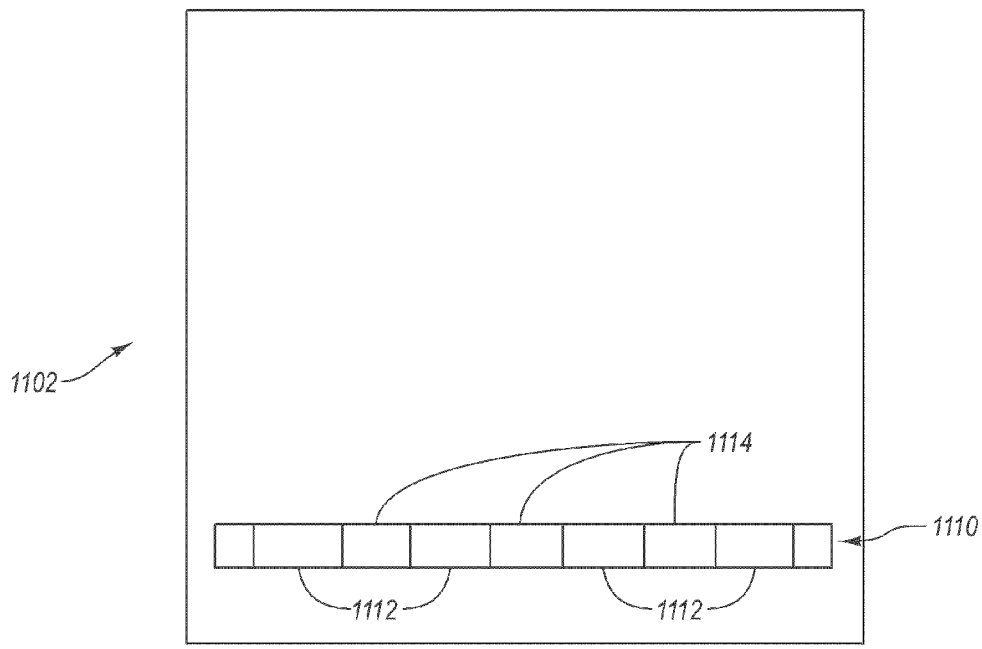
Figure 11B:
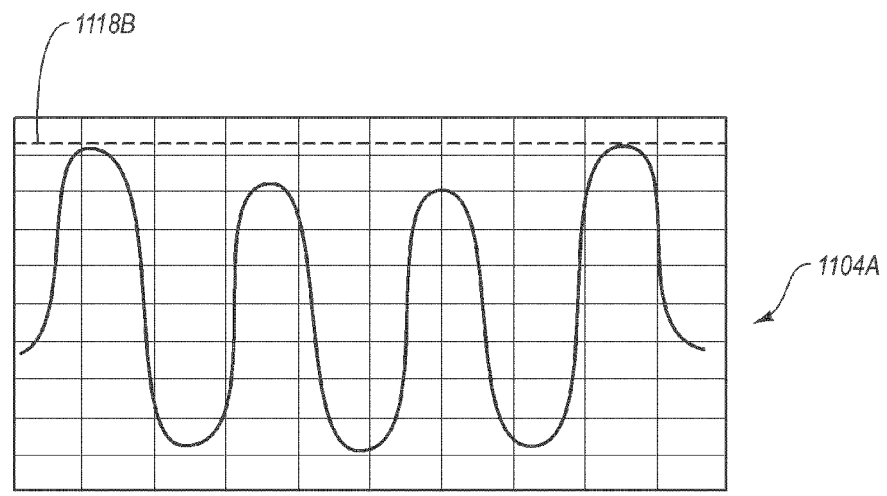
Figure 11B:
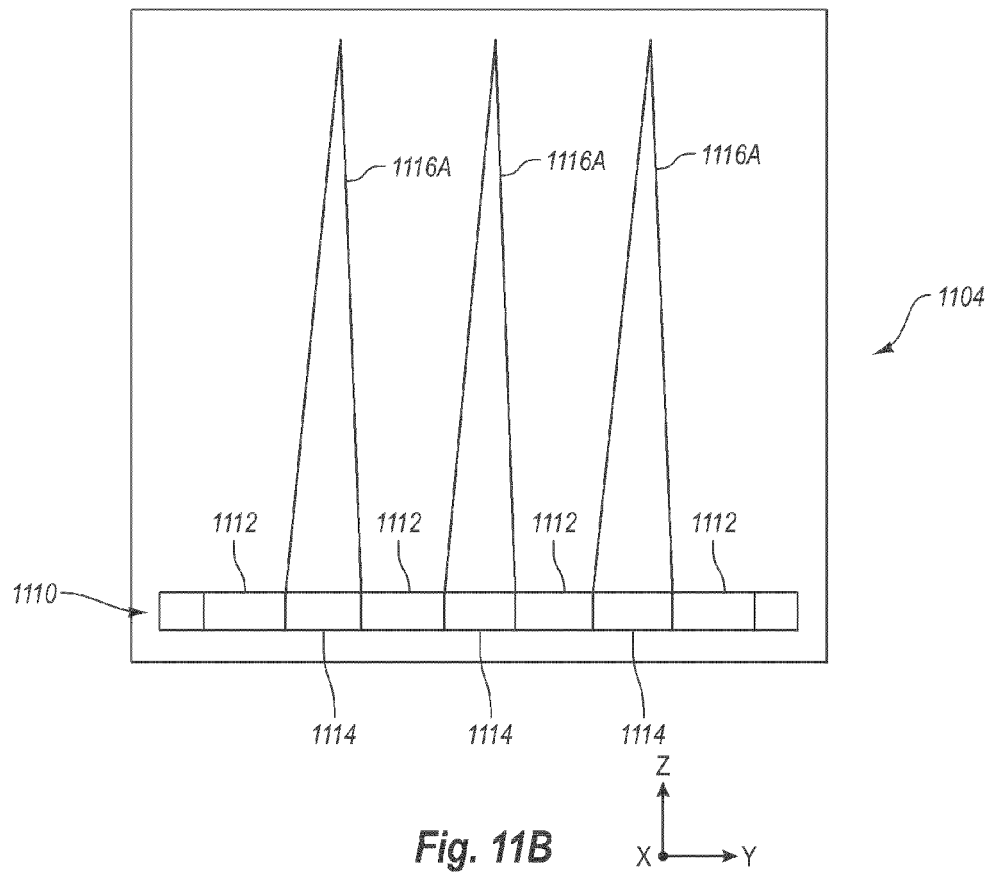
Figure 11C:
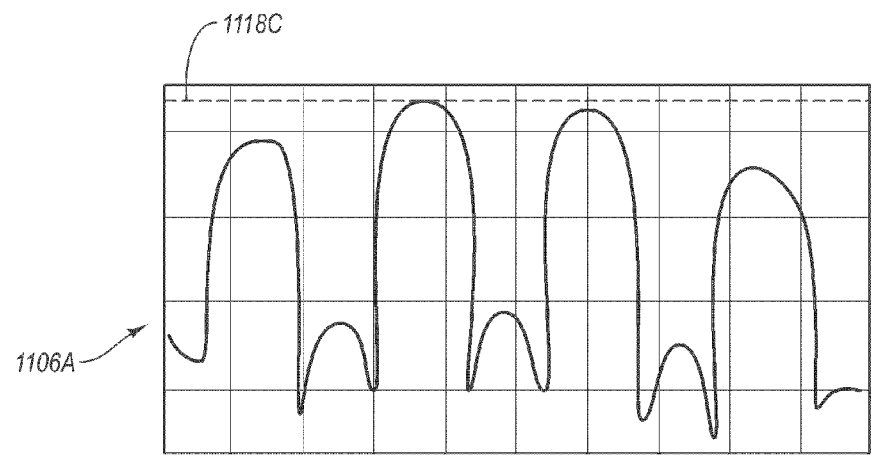
Figure 11C:
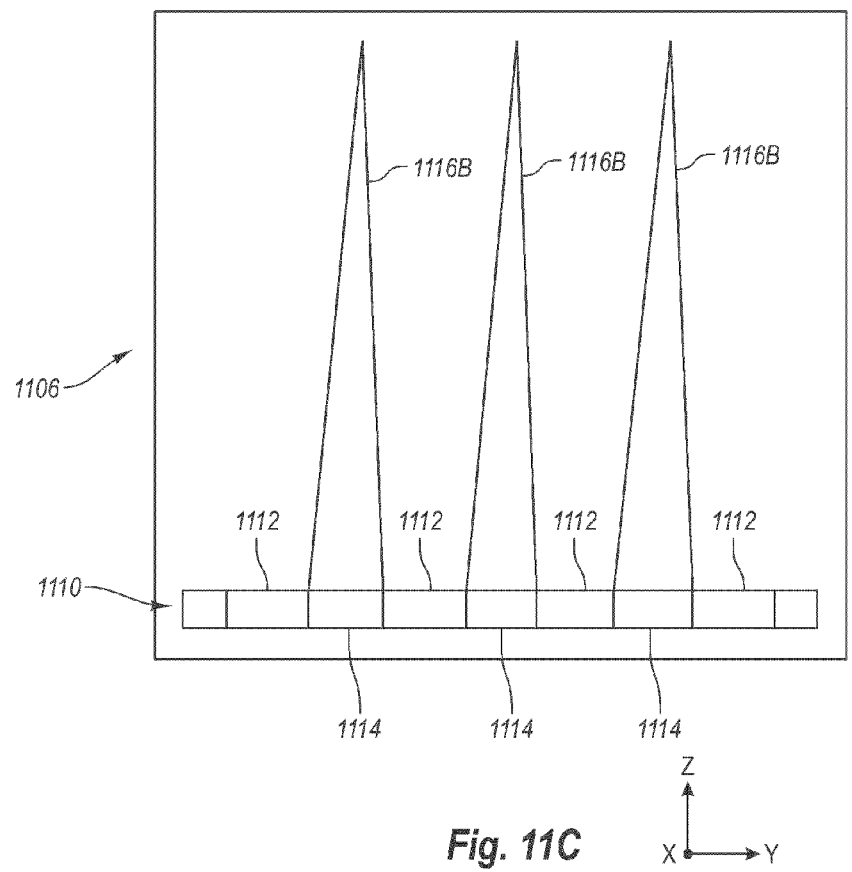
Figure 11D:
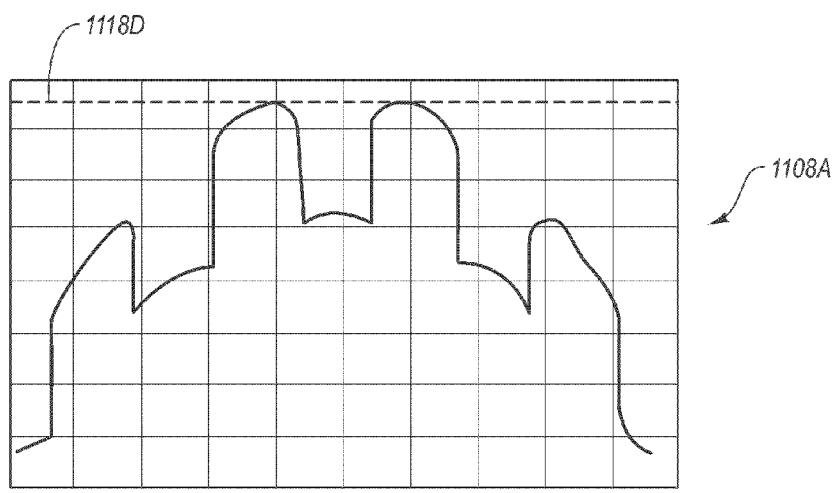
Figure 11D:
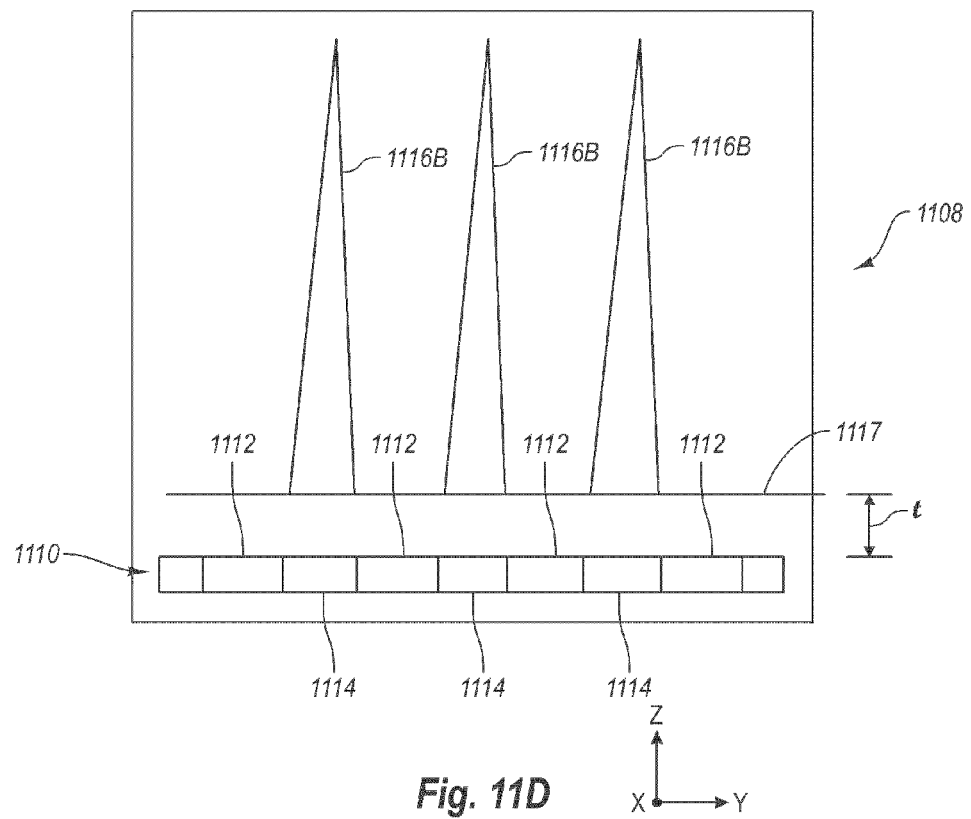

Turning next to FIG. 8, a fourth example PV module 800 is disclosed that may correspond to the PV modules 116, 124, 140 of FIGS. 1A-1D. FIG. 8 depicts a simplified front view of the PV module 800. The PV module 700 can be similar in some respects to the PV modules 200, 500, and 700 of FIGS. 2A-2C, 5A-5B, and 7. For instance, the PV module 800 can comprise a front plate 802, a plurality of PV cells 804 (collectively "PV cell array 804") disposed beneath the front plate 802 that can be arranged in rows 806 and columns 808, a plurality of spacers 810—including a bottom spacer 810A and top spacer 810B—interposed among the rows 806, and a backsheet 812.

Although not shown in FIG. 8, the PV module 800 can further include an adhesive layer, a buffer layer, a power conversion device redundantly connected to the PV module 800, an active row-balancing device connected to an end of each of a plurality of the spacers 810 and/or other components described herein.

FIG. 8 additionally illustrates PV cells 804 that can have substantially trapezoidal shapes to minimize waste with PV cell stock. Inset 814 depicts two PV cells 804A and 804B arranged side-by-side. As can be seen, the PV cells 804 can be arranged in an alternating first orientation and second orientation that is a reverse orientation of the first orientation. Additional details regarding PV modules that include trapezoidally shaped PV cells are disclosed in U.S. patent application Ser. No. 12/357,277 filed Jan. 21, 2009 by Dallas W. Meyer for a DETACHABLE LOUVER SYSTEM, which application is herein incorporated by reference in its entirety.

VI. General Aspects of Some Photovoltaic Modules

PV modules according to embodiments of the invention can implement a variety of configurations and can operate under a variety of uniform and/or non-uniform illumination conditions. As mentioned above, PV modules according to embodiments of the invention can include a plurality of rows, each row including a plurality of parallel-connected PV cells. When one or more PV cells in a row are blocked, e.g. due to non-uniform illumination, the implementation of parallel-connected PV cells in the row can allow current to rebalance in the row by flowing around the one or more blocked PV cells through the other PV cells in the row.

Alternately or additionally, some embodiments of the invention can include power conversion devices redundantly coupled to a PV module. The power conversion device can condition output power of the PV module, as described above.

Alternately or additionally, embodiments of the invention can include PV modules that implement passive row-balancing across PV cells in each row and/or across rows in the PV module using bypass diodes, or the like. When a row becomes blocked, the bypass diode coupled around the blocked row can open up and allow current to flow around the blocked row.

Alternately or additionally, embodiments of the invention can include PV modules that implement active row-balancing using active electronic devices. When a row becomes blocked, the active electronic devices can feed current into the blocked row to maximize the power output of the PV module.

A. Fully Populated Photovoltaic Modules

Embodiments of the invention can alternately or additionally include fully populated PV modules and/or sparsely populated PV modules. Fully populated PV modules include PV modules where the percentage of the surface area at the front of the PV module occupied by PV cells is 85% or more. In contrast, sparsely populated PV modules include PV modules where the percentage of the surface area at the front of the PV module occupied by PV cells is less than 85%.

For instance, FIGS. 9A and 9B each depict fully populated PV modules 902 and 904. To implement a fully populated configuration, the PV modules 902 and 904 can implement spacers that are interconnected between the rows of PV cells where the spacers are not in the same layer as the rows of PV cells.

For example, FIG. 10 discloses a simplified cross-section of a PV module that may correspond to one or more of the PV module 902 or 904. As shown, the PV module of FIG. 10 can include a front plate 1002, multiple rows 1004 of PV cells coupled behind the front plate 1002 with an adhesive layer 1006, multiple spacers 1008 disposed behind the rows 1004 and interconnected between the rows 1006, a buffer layer 1010, and a backsheet 1012. In this and other embodiments, placing the spacers 1008 behind the rows 1004 can allow the rows 1004 to be positioned closely together for a fully populated PV module 1000. The buffer layer 1010 may be a non-conductive layer.

Returning to FIG. 9A, the PV module 902 of FIG. 9A can include a power conversion device 906. The PV module 902 can have a 250-watt base output and/or a 600 watt maximum output. Optionally, the PV module 902 can be implemented in conjunction with a light reflector disposed adjacent to the PV module 902 that concentrates illumination onto the PV module 902. Although the light reflector can create non-uniform illumination across the PV module 902, the use of the light reflector can still increase the power output of the PV module 902 anywhere from 1.2 to 2 times or more in some embodiments.

The PV module 904 of FIG. 9B can include a power conversion device 908 and an active row-balancing device 910. The PV module 904 can have a 280-watt base output and/or a 650-watt maximum output. Optionally, the PV module 904 can be implemented in conjunction with a light reflector disposed adjacent to the PV module 904 that concentrates illumination onto the PV module 904. Although the light reflector can create non-uniform illumination across the PV module 904, the use of the light reflector and inclusion of the active row-balancing device 910 can still increase the power output of the PV module 904 anywhere from 1.3 to 2 times or higher in some embodiments.

B. Sparsely Populated Photovoltaic Modules

FIGS. 9C and 9D each depict sparsely populated PV modules 912 and 904. To implement a sparsely populated configuration, the PV modules 912, 914 can implement spacers that are interconnected between the rows of PV cells where the spacers are additionally interposed between the rows of PV cells, such as the spacers 210 of FIG. 2B that are interconnected and interposed between the rows 206.

In some embodiments, one or more reflectors can be implemented with the PV modules 912, 914 to reflect light that would otherwise impinge between the rows onto the rows of PV cells. The one or more light reflectors can comprise louvers in some embodiments. Accordingly, the louvers or other reflectors can be placed immediately in front of the spacers, while leaving the rows of PV cells exposed to light, such that light can impinge directly on the rows of PV cells, and/or light can be reflected from the louvers onto the rows of PV cells. Because the PV cells used in a PV module can represent a significant cost in the total cost of the PV module, sparsely populated PV modules 912 and 914 can be significantly lower in cost than fully populated PV modules 902, 904, even with the cost of louvers or other reflectors added into the total cost of the sparsely populated PV modules 912, 914.

As shown in FIG. 9C, the PV module 912 can include a power conversion device 916. The PV module 912 can have a 300-watt base output.

As shown in FIG. 9D, the PV module 914 can include a power conversion device 918 and an active row-balancing device 920. The PV module 914 can have a 330-watt base output in some embodiments.

C. Thermal Management in Photovoltaic Modules

In some embodiments, the PV cells of a PV module can operate less efficiently as the temperature of the PV cells increases. However, embodiments of the invention can include aspects and features for managing the heat generated by the PV cells of a PV module. In some embodiments, as already explained above, spacers can be interposed between rows of PV cells such that heat generated by the PV cells can be conductively transferred from the PV cells to the spacers, and then radiated away from the PV module by the highly emissive spacers. For example, the PV module 200 of FIGS. 2A-2C can include spacers 210 having an emissivity greater than 0.6 that are interposed between rows 206 of PV cells 204 in some embodiments.

Alternately or additionally, the backsheet of the PV module can be highly emissive and can be thermally coupled to the PV cells of the PV module such that heat generated by the PV cells can be conductively transferred from the PV cells to the backsheet, and then radiated away from the PV module by the highly emissive backsheet. For instance, in some embodiments, the PV module 200 of FIGS. 2A-2C can include a backsheet 212 having an emissivity greater than 0.6, the backsheet being thermally coupled to the PV cells 204 via buffer layer 216.

Alternately or additionally, the PV module can be included in a PV system that also includes a plurality of louvers arranged in front of the spacers of the PV module. Generally, the louvers can be arranged such that heat is conductively transferred from the PV cells of the PV module to the spacers, radiatively transferred from the spacers to the louvers, and conductively transferred from the louvers to the air. The louvers can provide a large surface area for heat exchange to cool the PV module.

For instance, FIGS. 11A-11D disclose cross-sectional views of a plurality of configurations 1102, 1104, 1106, and 1108, respectively, that may be implemented in a PV system comprising a PV module and optionally a plurality of louvers. In particular, each of the PV system configurations 1102-1108 can include a PV module, while only the PV system configurations 1104-1108 include louvers. At the outset, it should be noted that the PV system configurations 1102-1108 are not drawn to scale.

Each of the PV system configurations 1102-1108 can include a PV module 1110 comprising rows 1112 of PV cells and spacers 1114 interposed between the rows 1112. Although not shown, the PV module 1110 can additionally include a front plate disposed in front of and coupled to the rows 1112 and spacers 1114. Alternately or additionally, the PV module 1110 can include a power conversion device, active row-balancing device, and/or other components described herein.

Additionally, PV system configuration 1104 includes louvers 1116A and PV system configurations 1106 and 1108 include louvers 1116B. Each of louvers 1116A and 1116B can have a substantially triangular and asymmetric cross-sectional shape. Alternately or additionally, the louvers can have a quasi-triangular and/or symmetric cross-sectional shape. The substantially triangular cross-sectional shape of the louvers 1116A can be closed on all three sides, while the substantially triangular cross-sectional shape of the louvers 1116B can be open along the bottom side nearest the PV module 1110.

The louvers 1116 can be disposed in front of spacers 1114 while leaving rows 1112 exposed to receive solar radiation. In this case, light rays can impinge on the rows 1112 directly from the sun and/or light rays can reflect off the louvers 1116 before impinging on the rows 1112.

In PV system configuration 1104, the louvers 1116A can have closed bottoms in mechanical contact with the PV module 1110 immediately in front of the spacers 1114. In PV system configuration 1106, the louvers 1116B can have open bottoms that are also in mechanical contact with the PV module 1110 immediately in front of the spacers 1114. In PV system configuration 1108, the louvers 1116B can have open bottoms that are not in mechanical contact with the PV module 1110 immediately in front of the spacers 1114. Instead, in the PV system configuration 1108, the open bottoms of louvers 1116B can be spaced apart from the PV module 1110 by a separation layer 1117. The separation layer can comprise air in some embodiments and can alternately or additionally have a thickness t between $1/16$ inches and $3/4$ inches.

In some embodiments, the louvers 1116 can be arranged in a detachable louver system that can include a frame to support the louvers 1116 and to removably couple the louvers 1116 to the PV module 1110. Additional aspects and features of louvers and detachable louver systems are disclosed in U.S. patent application Ser. No. 12/357,277 filed Jan. 21, 2009 by Dallas W. Meyer for a DETACHABLE LOUVER SYSTEM.

In each of the PV system configurations 1102-1108, the PV module can include an aluminum backsheet (not shown). Alternately or additionally, each of the spacers 1114 can comprise a highly emissive spacer.

FIG. 11 additionally discloses temperature profiles 1102A, 1104A, 1106A and 1108A that may correspond, respectively, to each of PV system configurations 1102-1108 during operation. The temperature profiles 1102A-1108A graphically represent the temperature (y-axis) at the surface of the PV module 1110 as a function of position (x-axis) on the surface of the PV module 1110 for the PV system configurations 1102-1108. Temperature profiles 1102A-1108A further disclose, respectively, maximum operating temperatures 1118A, 1118B, 1118C, 1118D of PV system configurations 1102-1108.

For PV system configuration 1102, the maximum operating temperature 1118A can be about 60.9° C. For PV system configuration 1104, the maximum operating temperature 1118B can be about 56.2° C. For PV system configuration 1106, the maximum operating temperature 1118C can be about 50.7° C. For PV system configuration 1108, the maximum operating temperature 1118D can be about 46.7° C.

As can be seen by the thermal profiles 1102A-1108A, the implementation of louvers in a PV system configuration 1104, 1106, 1108 can significantly reduce the maximum operating temperature of the PV module 1110 compared to a PV system configuration 1102 lacking louvers. For instance, the implementation of louvers 1116A having closed bottoms in direct contact with PV module 1110 in PV system configuration 1104 can reduce the maximum operating temperature at the surface of PV module 1110 by about 4.7° C. in this example. Alternately, the implementation of louvers 1116B having open bottoms in direct contact with PV module 1110 in PV system configuration 1106 can reduce the maximum operating temperature at the surface of PV module 1110 by about 10.2° C. in this example. Alternately, the implementation of louvers 1116B having open bottoms spaced apart from the PV module 1110 by a separation layer 1117 in PV system configuration 1108 can reduce the maximum operating temperature at the surface of PV module 1110 by about 14.2° C. in this example.

It will be appreciated that the reduced maximum operating temperature in PV system configurations 1104, 1106, 1108 can allow the rows 1112 of PV cells in PV module 1110 to operate more efficiently in the PV system configurations 1104, 1106, 1108 than in the PV system configuration 1102.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A photovoltaic module, comprising:
a conductive backsheet extending continuously and uninterrupted behind all of a plurality of photovoltaic cells of the photovoltaic module;
a non-conductive layer disposed on the conductive backsheet;
the plurality of photovoltaic cells disposed above the non-conductive layer, the plurality of photovoltaic cells arranged in a plurality of rows and collectively generating a first power output characterized by a first voltage, wherein:
each row includes two or more photovoltaic cells;
the photovoltaic cells within each row are connected to each other in parallel;
the plurality of rows are connected in series; and
a top row is connected to the conductive backsheet;
a power conversion device redundantly connected to a bottom row of the plurality of rows and to the conductive backsheet to form a complete circuit, the power conversion device maintaining a composite electrical impedance of a plurality of power conversion circuits of the power conversion device to ensure the plurality of photovoltaic cells in the photovoltaic module are operating at maximum peak power such that a second voltage from the power conversion device is higher than the first voltage generated by the plurality of photovoltaic cells; and
a plurality of conductive spacers that the plurality of rows are interconnected between, wherein:
the power conversion device includes a printed circuit board mounted along an edge of the photovoltaic module, the printed circuit board including a larger planar surface and a different smaller planar surface, wherein the larger planar surface of the printed circuit board is substantially normal to a plane defined by the conductive backsheet;
the plurality of rows are connected in series via the plurality of conductive spacers;
at least a portion of a bottom conductive spacer extends beyond a corresponding edge of the conductive backsheet, the bottom conductive spacer being coupled between the power conversion device and the bottom row;
the photovoltaic module further comprises a first stress-relief fold formed in the conductive backsheet and a second stress-relief fold formed in the bottom conductive spacer; and
the first stress-relief fold interconnects the conductive backsheet to the power conversion device and the second stress-relief fold interconnects the power conversion device in series with the plurality of rows.

2. The photovoltaic module of claim 1, wherein a voltage generated across the plurality of photovoltaic cells from the top row to the bottom row is less than or equal to 10 volts.

3. The photovoltaic module of claim 1, wherein the plurality of photovoltaic cells are sealed within a protective enclosure to prevent exposure of the plurality of photovoltaic cells to moisture, the protective enclosure comprising the conductive backsheet, a solar edge tape, and a front plate disposed above the plurality of photovoltaic cells.

4. The photovoltaic module of claim 1, wherein the conductive backsheet comprises electrical ground for the plurality of photovoltaic cells and the power conversion device.

5. The photovoltaic module of claim 1, wherein:
at least some of the heat generated by the plurality of photovoltaic cells is conductively transferred to the conductive backsheet; and
the conductive backsheet radiates at least some of the heat conductively transferred to the conductive backsheet away from the photovoltaic module.

6. The photovoltaic module of claim 1, wherein the power conversion device comprises two complementary connectors disposed on opposite ends of the power conversion device, the two complementary connectors allowing the photovoltaic module and power conversion device to be connected side-to-side to one or more similarly configured photovoltaic modules and power conversion devices.

7. The photovoltaic module of claim 1, wherein the power conversion device includes a ground terminal post and a positive terminal post, each configured to receive a different conductive wire having a cross-sectional area greater than 3 $mm^2$, the different conductive wires transmitting the second power output to a point of use.

8. The photovoltaic module of claim 1, wherein the second voltage is less than or equal to 60 volts, the photovoltaic module further comprising an active ground fault detection device that identifies interrupts in the second power output and limits energy flow out of the photovoltaic module to less than 24 joules after identifying an interrupt.

9. The photovoltaic module of claim 8, wherein the conductive backsheet comprises an exposed electrical ground and the non-conductive layer is less than 10 mils thick.

10. The photovoltaic module of claim 1, wherein:
at least some heat generated by the plurality of photovoltaic cells during operation is conductively transferred to the conductive backsheet, whereupon the back of the conductive backsheet radiates at least some of the heat away from the back of the photovoltaic module; or
the conductive backsheet generates heat in response to absorbing light rays incident on the back of the conductive backsheet, at least some of the heat is conductively transferred to the plurality of photovoltaic cells, and the photovoltaic cells radiate heat away from the front of the photovoltaic module to melt ice or snow that has accumulated on the front of the photovoltaic module.

11. The photovoltaic module of claim 1, wherein the photovoltaic module is mounted to a wall structure and receives solar radiation directly from the sun or indirectly via reflection from one or more reflective materials disposed in, on or proximate to the wall structure, the received solar radiation being non-uniform in intensity across the front of the photovoltaic module.

12. The photovoltaic module of claim 11, wherein the one or more reflective materials comprise a window disposed in the wall structure.

13. The photovoltaic module of claim 1, wherein the plurality of rows are arranged side-by-side and the plurality of conductive spacers are disposed between the plurality of rows and the non-conductive layer to maximize photovoltaic cell density on a front side of the photovoltaic module.

14. The photovoltaic module of 1, further comprising a plurality of bypass diodes coupled in series with each other via the plurality of conductive spacers, each bypass diode connected in anti-parallel with a different row such that when a row is blocked, current can flow around the row through the corresponding bypass diode coupled in anti-parallel with the blocked row.

15. The photovoltaic module of claim 1, wherein each of the plurality of conductive spacers comprises solid copper, patterned copper, solid aluminum, or patterned aluminum.

16. The photovoltaic module of claim 1, wherein each of the plurality of photovoltaic cells is substantially rectangular or substantially trapezoidal in shape, further wherein each photovoltaic cell in each of the plurality of rows is connected to two conductive spacers between which each of the plurality of rows is interconnected.

17. The photovoltaic module of claim 1, further comprising an active row-balancing device individually coupled to at least some of the plurality of conductive spacers, the active-row balancing device feeding current into one or more of the plurality of rows to maximize power output of the photovoltaic module.

18. The photovoltaic module of claim 17, wherein the power conversion device draws operating power from the first power output and the active row-balancing device draws operating power from the second power output.

19. The photovoltaic module of claim 17, wherein one or both of the power conversion device and the active row-balancing device include a printed circuit board having a length-to-width aspect ratio greater than or equal to 20:1 and less than or equal to 40:1.

20. The photovoltaic module of claim 17, wherein one or both of the power conversion device and the active row-balancing device comprise consumer electronics.

21. The photovoltaic module of claim 17, wherein the active row-balancing device includes a plurality of active electronic devices, each of the plurality of active electronic devices comprising one or more of: a field effect transistor, a gate driver, an inductor, a capacitor, or a microcontroller.

22. The photovoltaic module of claim 21, wherein each of the plurality of active electronic devices is coupled in parallel with a corresponding one of the plurality of rows, each of the plurality of active electronic devices feeding current into the corresponding one of the plurality of rows when the corresponding one of the plurality of rows is blocked.

23. A photovoltaic system, comprising:
a photovoltaic module including:
a conductive backsheet extending continuously and uninterrupted behind all of a plurality of photovoltaic cells of the photovoltaic module;
a substantially transparent front plate;
the plurality of photovoltaic cells disposed between the conductive backsheet and the front plate, the photovoltaic cells arranged in a plurality of rows, the photovoltaic cells in each row being connected in parallel and the rows being connected in series;
a plurality of conductive spacers that the plurality of rows are interconnected between interposed between the photovoltaic cells, the conductive spacers including a top spacer and a bottom spacer, the top spacer interconnecting a top row to the conductive backsheet; and
a power conversion device redundantly connected to a bottom row via the bottom spacer and to the conductive backsheet to form a complete circuit, the power conversion device maintaining a composite electrical impedance of a plurality of power conversion circuits of the power conversion device to ensure the plurality of photovoltaic cells in the photovoltaic module are operating at maximum peak power such that a second voltage from the power conversion device is higher than the first voltage generated by the plurality of photovoltaic cells,
wherein the power conversion device includes a printed circuit board mounted along an edge of the photovoltaic module, the printed circuit board includes a larger planar surface and a different smaller planar surface, and the larger planar surface of the printed circuit board is substantially normal to a plane defined by the conductive backsheet; and
a plurality of louvers positioned above the conductive spacers and the front plate, the louvers reflecting solar radiation incident on the louvers onto the photovoltaic cells, wherein:
the plurality of rows are connected in series via the plurality of conductive spacers;
at least a portion of the bottom conductive spacer extends beyond a corresponding edge of the conductive backsheet;
the photovoltaic module further comprises a first stress-relief fold formed in the conductive backsheet and a second stress-relief fold formed in the bottom conductive spacer; and
the first stress-relief fold interconnects the conductive backsheet to the power conversion device and the second stress-relief fold interconnects the power conversion device in series with the plurality of rows.

24. The photovoltaic system of claim 23, wherein each of the louvers includes a base, the photovoltaic system further comprising a separation layer disposed between the front plate and the base of the louvers.

25. The photovoltaic system of claim 23, wherein each of the louvers comprises a thermally conductive material and facilitates cooling of the photovoltaic module.

* * * * *